US012641852B2

(12) United States Patent
Zhang et al.

(10) Patent No.: US 12,641,852 B2
(45) Date of Patent: May 26, 2026

(54) HIGH ELECTRON MOBILITY TRANSISTOR AND MANUFACTURING METHOD THEREOF, CHIP, AND ELECTRONIC DEVICE

(71) Applicant: HUAWEI TECHNOLOGIES CO., LTD., Shenzhen (CN)

(72) Inventors: Zhili Zhang, Suzhou (CN); Jin Rao, Shanghai (CN); Tao Liu, Shanghai (CN); Haijun Li, Suzhou (CN); Wei Lu, Shanghai (CN); Shuiming Li, Suzhou (CN); Cen Tang, Suzhou (CN); Qiang He, Suzhou (CN); Juncai Ma, Suzhou (CN); Chunhua Fan, Suzhou (CN); Yangyi Zhu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 434 days.

(21) Appl. No.: 18/334,541

(22) Filed: Jun. 14, 2023

(65) Prior Publication Data

US 2023/0343835 A1 Oct. 26, 2023

Related U.S. Application Data

(63) Continuation of application No. PCT/CN2020/136362, filed on Dec. 15, 2020.

(51) Int. Cl.
*H01L 29/40* (2006.01)
*H10D 30/01* (2025.01)
(Continued)

(52) U.S. Cl.
CPC ......... *H10D 64/111* (2025.01); *H10D 30/015* (2025.01); *H10D 30/475* (2025.01); *H10D 62/8503* (2025.01); *H10D 64/01* (2025.01)

(58) Field of Classification Search
None
See application file for complete search history.

(56) References Cited

U.S. PATENT DOCUMENTS

2007/0114569 A1* 5/2007 Wu ...................... H10D 30/015
257/E29.093
2020/0303533 A1* 9/2020 Guo ..................... H10D 30/015

FOREIGN PATENT DOCUMENTS

CN 110600536 A 12/2019

OTHER PUBLICATIONS

PCT International Search Report for Application No. PCT/CN2020/136362 dated Dec. 15, 2020, 10 pages.
(Continued)

*Primary Examiner* — William C Trapanese

(57) ABSTRACT

The technology of this application relates to a high electron mobility transistor including a GaN substrate layer, a barrier layer, a circuit layer, and a field plate that are sequentially stacked. The GaN substrate layer includes a main body layer and a channel layer that are stacked, the channel layer is adjacent to the barrier layer, the circuit layer includes a source, a drain, and a dielectric layer, the dielectric layer is disposed between the source and the drain, the field plate is disposed on a side that is of the dielectric layer and that is away from the barrier layer, an orthographic projection of the field plate on the channel layer is a field plate projection, the channel layer includes a modulation region and a non-modulation region, the non-modulation region surrounds the modulation region, the modulation region and the field plate projection at least partially overlap.

20 Claims, 22 Drawing Sheets

(51) Int. Cl.
     *H10D 30/47*      (2025.01)
     *H10D 62/85*      (2025.01)
     *H10D 64/00*      (2025.01)
     *H10D 64/01*      (2025.01)

(56)               References Cited

OTHER PUBLICATIONS

European Search Report for EP Application No. 20965371.6 dated Dec. 21, 2023, 9 pages.

* cited by examiner

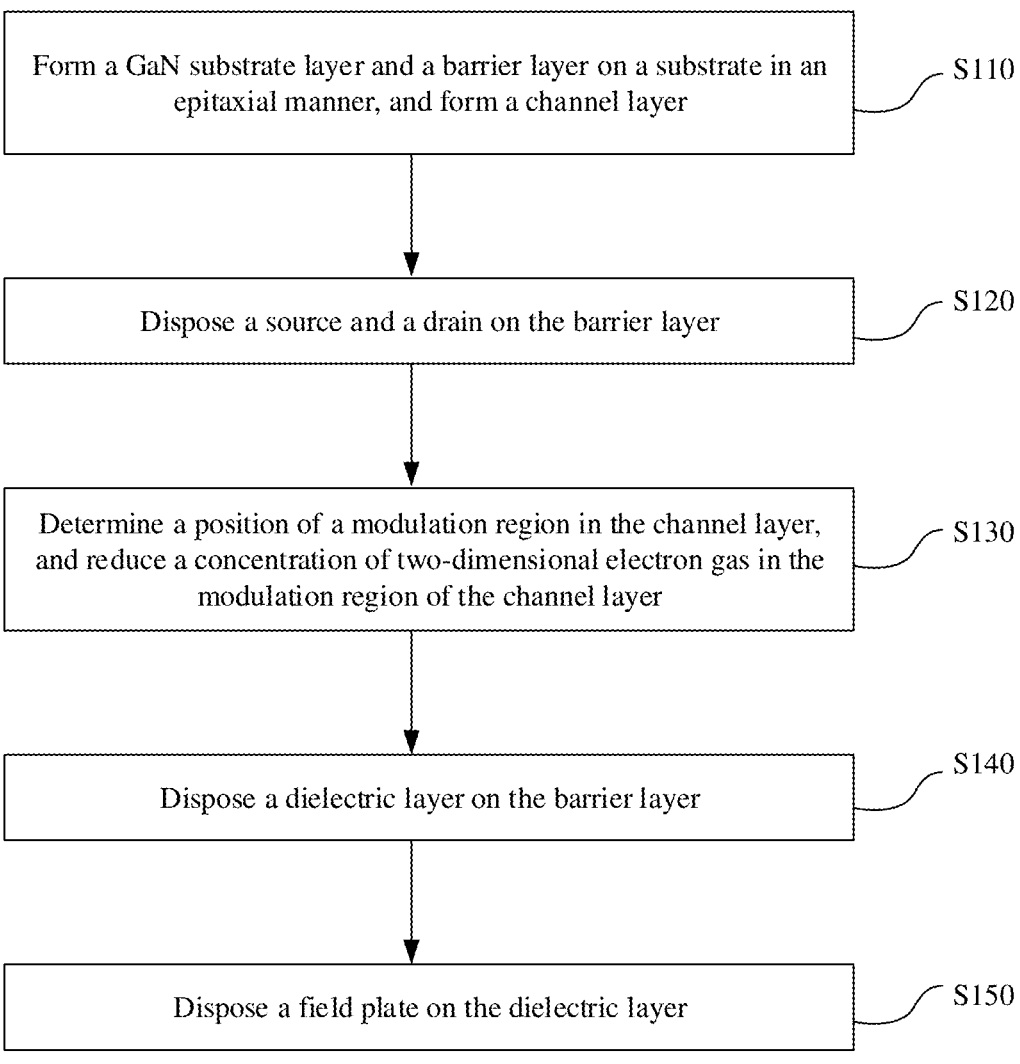

Form a GaN substrate layer and a barrier layer on a substrate in an epitaxial manner, and form a channel layer — S110

Dispose a source and a drain on the barrier layer — S120

Determine a position of a modulation region in the channel layer, and reduce a concentration of two-dimensional electron gas in the modulation region of the channel layer — S130

Dispose a dielectric layer on the barrier layer — S140

Dispose a field plate on the dielectric layer — S150

HIGH ELECTRON MOBILITY TRANSISTOR AND MANUFACTURING METHOD THEREOF, CHIP, AND ELECTRONIC DEVICE

CROSS-REFERENCE TO RELATED APPLICATIONS

This application is a continuation of International Application No. PCT/CN2020/136362, filed on Dec. 15, 2020, the disclosure of which is hereby incorporated by reference in its entirety.

TECHNICAL FIELD

This application relates to the field of semiconductor technologies, and in particular, to a high electron mobility transistor and a manufacturing method thereof, and a chip and an electronic device having the high electron mobility transistor.

BACKGROUND

With the development of semiconductor technologies, people's requirements for device performance are constantly increasing, which promotes the emergence of new semiconductor materials and devices. As a typical third-generation wide bandgap semiconductor material, a gallium nitride (GaN) material has features such as high thermal conductivity, high electron drift rate, high breakdown field strength, corrosion resistance, high temperature resistance, and chemical stability compared with the first-generation semiconductor silicon and the second-generation semiconductor gallium arsenide, and is widely used in high-frequency, high-temperature, and high-power microwave fields.

An aluminum gallium nitride/gallium nitride high electron mobility transistor (AlGaN/GaN HEMT) is a gallium nitride-based device with an AlGaN/GaN heterojunction as a basic structure. Because two-dimensional electron gas formed by the heterojunction has characteristics of high concentration and high mobility, a current conduction capability is widely applied to the microwave radio frequency field. However, for the high electron mobility transistor, a concentration of two-dimensional electron gas significantly affects performance of the high electron mobility transistor. For example, in a same device structure, a lower concentration of two-dimensional electron gas indicates a higher probability of being depleted under an action of an electric field, a smaller parasitic capacitance, a higher gain characteristic of the device. However, a low concentration of two-dimensional electron gas reduces output power density of the high electron mobility transistor. Therefore, how to make the high electron mobility transistor have both a high gain and high power density becomes a focus of research in this field.

SUMMARY

This application provides a high electron mobility transistor. A concentration of two-dimensional electron gas in a corresponding channel layer below a field plate in the transistor is adjusted, so that a power characteristic of the transistor is ensured, and gain performance of the transistor device is improved.

According to a first aspect, this application provides a high electron mobility transistor, including a GaN substrate layer, a barrier layer, and a circuit layer that are sequentially stacked, where the GaN substrate layer includes a main body layer and a channel layer that are stacked, the channel layer is adjacent to the barrier layer, the circuit layer includes a source, a drain, and a dielectric layer, the dielectric layer is disposed between the source and the drain, a field plate is disposed on a side that is of the dielectric layer and that is away from the barrier layer, an orthographic projection of the field plate on the channel layer is a field plate projection, the channel layer includes a modulation region and a non-modulation region, the non-modulation region surrounds the modulation region, the modulation region and the field plate projection at least partially overlap, and a concentration of two-dimensional electron gas in the modulation region is less than a concentration of two-dimensional electron gas in the non-modulation region.

The high electron mobility transistor provided in this application has two advantages: high power density and high gain performance. When the high electron mobility transistor is applied to an electronic device, the electronic device has a smaller size under a same power requirement because of the high power density of the high electron mobility transistor. This facilitates a miniaturization design of the electronic device. In addition, the high gain performance of the high electron mobility transistor enables the electronic device to have a better information exchange speed.

In this application, the GaN substrate layer and the barrier layer located on the GaN substrate layer are formed through epitaxial processing on the substrate. The epitaxial manner herein may be metal-organic chemical vapor deposition, or may be molecular beam epitaxy. The substrate may be one of a silicon substrate, a diamond substrate, a sapphire substrate, or a silicon carbide substrate. It should be noted that, a thickness range of the GaN substrate layer obtained through epitaxial processing is 100 nm to 8000 nm, and a thickness range of the obtained barrier layer is 2 nm to 50 nm. A material of the barrier layer may be aluminum gallium nitride (AlGaN), aluminum nitride (AlN), indium gallium nitride (InGaN), or the like. In addition, the source and the drain are manufactured on the barrier layer through photo-etching and metal deposition. It may be known that a channel layer formed by a heterostructure exists at a boundary between the GaN substrate layer and the barrier layer, and two-dimensional electron gas is distributed in the channel layer. Current conduction between the source and the drain can be implemented by using the two-dimensional electron gas, that is, the source and the drain are in ohmic contact with the two-dimensional electron gas respectively. The dielectric layer is further formed between the source and the drain in a deposition manner. The dielectric layer includes a first dielectric layer and a second dielectric layer. The first dielectric layer is deposited on the barrier layer. Photoetching, etching, and metal deposition processing are performed on a surface that is of the first dielectric layer and that is away from the barrier layer, to form a gate electrode. Then, secondary deposition is performed on the first dielectric layer to obtain the second dielectric layer, to cover the gate electrode and the first dielectric layer. Deposition processing is performed on a surface of the second dielectric layer, to obtain the field plate. It should be noted that the channel layer includes the modulation region. The modulation region herein at least partially overlaps a projection region below the field plate. The projection region below the field plate refers to a projection region of the field plate on the channel layer. The projection herein refers to projection of the field plate in a direction perpendicular to the channel layer. The at least partially overlapping herein means that the modulation region and the projection region below the field plate should have an intersection. In a specific case, the modulation region may fully cover the projection region below the field plate, or the projection region below the field plate may fully cover the modulation region, or there may be another case in which an intersection exists. The concentration of the two-dimensional electron gas in the modulation region is less than the concentration of the two-dimensional electron gas in the non-modulation region. The field plate is configured to affect electric field distribution of the high electron mobility transistor. An electric field of a region right below the field plate, that is, a region that overlaps the projection region below the field plate, is relatively strong. In this application, the modulation region and the projection region below the field plate at least partially overlap. Because the concentration of the two-dimensional electron gas in the modulation region decreases, free electrons in the modulation region are easily depleted under an action of the electric field. Consequently, a parasitic capacitance becomes smaller, and a device gain of the transistor becomes higher. In addition, the adjustment of the concentration of the two-dimensional electron gas is only for the modulation region, and the local adjustment has little impact on an electron gas concentration in the entire channel layer, and therefore does not affect a current conduction capability between the source and the drain, that is, the high electron mobility transistor still maintains high power density in this case.

In a specific embodiment, an area of the modulation region accounts for 5% to 200% of an area of the projection region below the field plate. Herein, the projection region below the field plate and the modulation region have an overlapping part. The following uses three extreme cases for description. In one case is that the modulation region is completely covered by the projection region below the field plate, that is, the modulation region occupies only a part of the projection region, and an extreme case is that the area of the modulation region accounts for 5% of the area of the projection region below the field plate. In another case, the modulation region completely overlaps the projection region below the field plate, that is, the projection region below the field plate is the modulation region, and the area of the modulation region accounts for 100% of the area of the projection region below the field plate. In another case, the modulation region fully covers the projection region below the field plate, that is, the projection region occupies only a part of the modulation region, and the area of the modulation region accounts for 200% of the area of the projection region below the field plate.

In a specific embodiment, the modulation region falls within the projection region below the field plate. It can be understood that, in this embodiment, the area of the projection region below the field plate is greater than the area of the modulation region. In this case, the modulation region completely falls within the projection region below the field plate. When the electron gas concentration in the modulation region decreases, a parasitic capacitance of the projection region that overlaps the modulation region decreases, thereby improving gain performance of the device.

In a specific embodiment, the modulation region completely overlaps the projection region below the field plate. It may be understood that in this embodiment, the area of the projection region below the field plate is equal to the area of the modulation region. When the electron gas concentration in the modulation region decreases, a parasitic capacitance of the projection region that completely overlaps the modulation region decreases, thereby improving gain performance of the device.

In a specific embodiment, the modulation region falls within the projection region below the field plate. It may be understood that, in this embodiment, the area of the projection region below the field plate is smaller than the area of the modulation region. In this case, the projection region below the field plate completely falls within the modulation region. When the electron gas concentration in the modulation region decreases, the parasitic capacitance of the projection region that overlaps the modulation region decreases, thereby improving gain performance of the device.

In a specific embodiment, the barrier layer includes a fluorine ion injection region, and the fluorine ion injection region is a projection region of the modulation region on the barrier layer. It may be understood that, when fluorine ions are injected into the barrier layer, the negatively charged fluorine ions deplete free electrons inside the barrier layer, and the two-dimensional electron gas corresponding to the modulation region is depleted by the negatively charged fluorine ions, thereby reducing the concentration of the two-dimensional electron gas in the modulation region.

In a specific embodiment, a size range of the fluorine ion injection region in a direction perpendicular to the barrier layer is 1 nm to 100 nm, and a fluorine ion concentration of the fluorine ion injection region is $10^{12}/cm^2$ to $10^{15}/cm^2$. It may be understood that, injection of fluorine ions directly causes a decrease in a two-dimensional electron gas concentration. Therefore, an injection depth of the fluorine ions is inversely proportional to a magnitude of the two-dimensional electron gas concentration. A larger injection depth indicates a lower two-dimensional electron gas concentration. To ensure a high gain and high power density of the entire device, the concentration of the two-dimensional electron gas in the modulation region has a value range, and the corresponding injection depth of fluorine ions also has a range, that is, 1 nm to 100 nm. Similarly, there is also a specific limitation on the injection concentration of the fluorine ions, and a specific range is $10^{12}/cm^2$ to $10^{15}/cm^2$.

In a specific embodiment, the barrier layer includes an etched region, and the etched region is the projection region of the modulation region on the barrier layer. It may be understood that the projection region of the modulation region on the barrier layer is a region that is etched on an etching surface, that is, the etched region. Because the barrier layer corresponding to the etched region is etched, formation of the channel layer is related to the barrier layer and the GaN substrate layer. Therefore, the channel layer corresponding to the etched region is affected, that is, the concentration of the two-dimensional electron gas in the channel layer corresponding to the etched region is reduced.

In a specific embodiment, a growth region is disposed on a surface that is of the barrier layer and that faces the dielectric layer, the growth region is the projection region of the modulation region on the barrier layer, and the growth region is used to grow a high-power function material. The growth region is disposed to grow a high-power function material. The high-power function material herein may be a P-type semiconductor, nickel oxide, metal, or the like. The high-power function material can generate an internal electric potential, so as to reduce a concentration of two-dimensional electron gas in a corresponding region. In this embodiment, the high-power function material is grown in the projection region of the modulation region on the barrier layer, so that the concentration of the two-dimensional electron gas in the modulation region can be correspondingly reduced.

In a specific embodiment, a thickness of the high-power function material in the growth region is 2 nm to 200 nm. The thickness of the high-power function material in the growth region determines a concentration of consumed two-dimensional electron gas. If the thickness of the high-power function material is less than 2 nm, the concentration of the two-dimensional electron gas in the modulation region does not change obviously, and the device gain of the high electron mobility transistor does not increase. If the thickness of the high-power function material is greater than 200 nm, the concentration of the two-dimensional electron gas in the corresponding modulation region is greatly affected (e.g., reduced), and the power density of the high electron mobility transistor decreases.

In a specific embodiment, a concentration range of the two-dimensional electron gas in the modulation region is $10^{12}/cm^2$ to $10^{13}/cm^2$. In this embodiment, a concentration of two-dimensional electron gas in a conventional channel layer is maintained at about $10^{13}/cm^2$. Under this concentration, a connection and disconnection effect of a current between the source and the drain can be ensured. However, the two-dimensional electron gas of this concentration causes an increase of a parasitic capacitor in the corresponding modulation region below the field plate, and indirectly increases charging and discharging times of the parasitic capacitor, thereby reducing a device gain of the transistor. Specifically, in this embodiment, a concentration range of the two-dimensional electron gas in the modulation region is $10^{12}/cm^2$ to $10^{13}/cm^2$. The two-dimensional electron gas within this concentration range does not affect a current conduction capability between the source and the drain, and reduces the parasitic capacitance, thereby improving the device gain of the transistor.

In addition, this application further provides a manufacturing method for a high electron mobility transistor, including the following steps: First, a GaN substrate layer and a barrier layer are formed on a substrate in an epitaxial manner, where the GaN substrate layer includes a channel layer. A method for forming the GaN substrate layer and the barrier layer in an epitaxial manner includes but is not limited to metal-organic chemical vapor deposition or molecular beam epitaxy. In a process of forming the GaN substrate layer and the barrier layer in an epitaxial manner, the channel layer is formed at a junction between the GaN substrate layer and the barrier layer, and the channel layer is located inside the GaN substrate layer. Then, a source and a drain are formed on the barrier layer. Specifically, the source and the drain are formed on the barrier layer through photoetching and metal deposition. Then, a position of a modulation region in the channel layer is determined, and a concentration of two-dimensional electron gas in the modulation region of the channel layer is reduced, where the modulation region at least partially overlaps a projection region below a preset position of a field plate. Then, after the concentration of the two-dimensional electron gas is adjusted, a dielectric layer is disposed on the barrier layer, where the dielectric layer is located between the source and the drain. Finally, the field plate is disposed on the dielectric layer, where the projection region below the field plate overlaps the modulation region. For the high electron mobility transistor obtained by using the method, because the electron gas concentration in the modulation region corresponding to the field plate is reduced, a corresponding parasitic capacitance is reduced, and a device gain of the transistor is increased.

In a specific embodiment, the step of reducing a concentration of two-dimensional electron gas in the modulation region of the channel layer includes: injecting fluorine ions into the barrier layer, where a region in which the fluorine ions are injected is a projection region of the modulation region on the barrier layer. In this embodiment, after the fluorine ions are injected into the barrier layer, external free electrons are absorbed. In this way, two-dimensional electron gas in the channel layer is consumed, so that the concentration of the two-dimensional electron gas in the corresponding modulation region is reduced, thereby reducing the parasitic capacitance and improving the device gain of the high electron mobility transistor.

In a specific embodiment, an injection depth of the fluorine ions is 1 nm to 100 nm, and an injection concentration is $10^{12}/cm^2$ to $10^{15}/cm^2$. In this embodiment, both the injection depth and the injection concentration of the fluorine ions affect the concentration of the two-dimensional electron gas in the modulation region. A larger injection depth and a higher concentration of the injected fluorine ions indicate a larger decrease in the concentration of the two-dimensional electron gas in the corresponding modulation region. In this case, the device gain of the high electron mobility transistor is improved more obviously. However, there is a limitation on this adjustment, that is, an overall concentration of two-dimensional electron gas between the source and the drain cannot be obviously reduced, otherwise, the power density of the high electron mobility transistor is reduced.

In a specific embodiment, the step of reducing a concentration of two-dimensional electron gas in the modulation region of the channel layer includes: etching the barrier layer, where an etched region in the barrier layer is a projection region of the modulation region on the barrier layer. In this embodiment, the barrier layer is etched to reduce the concentration of the two-dimensional electron gas in the modulation region. It may be understood that the channel layer is generated between the barrier layer and the GaN substrate layer. When a thickness of the barrier layer changes, the channel layer in a corresponding region inevitably changes, that is, the concentration of the two-dimensional electron gas in the modulation region decreases. In this way, the concentration of the two-dimensional electron gas in the modulation region can be adjusted by etching the barrier layer, to achieve a high gain and high power density of the high electron mobility transistor.

In a specific embodiment, a depth of the barrier layer being etched is 2 nm to 50 nm. In this embodiment, the etching depth of the barrier layer is inversely proportional to the concentration of the two-dimensional electron gas in the modulation region. A larger etching depth indicates a smaller concentration of the corresponding two-dimensional electron gas. Therefore, when the barrier layer is being etched, the etching depth needs to be limited, that is, the etching depth of the barrier layer is 2 nm to 50 nm, so as to avoid a case in which the concentration of the two-dimensional electron gas does not change or is excessively low.

In a specific embodiment, the step of reducing a concentration of two-dimensional electron gas in the modulation region of the channel layer includes: growing a high-power function material on a surface that is of the barrier layer and that faces the dielectric layer, where a region used to grow the high-power function material is a projection region of the modulation region on the barrier layer. In this embodiment, the high-power function material is grown on the surface that is of the barrier layer and that faces the dielectric layer to reduce the concentration of the two-dimensional electron gas in the modulation region of the channel layer. It may be learned that the high-power function material herein is a material such as a P-type semiconductor, nickel oxide, or metal. When the high-power function material is grown on a surface of the dielectric layer, the concentration of the two-dimensional electron gas in the corresponding modulation region is reduced.

In a specific embodiment, a growth thickness of the high-power function material ranges from 2 nm to 200 nm. In this embodiment, the growth thickness of the high-power function is inversely proportional to the concentration of the two-dimensional electron gas in the modulation region, that is, a larger growth thickness indicates a higher two-dimensional electron gas concentration. Therefore, to avoid a case in which the concentration of the two-dimensional electron gas does not change or is excessively low, the growth thickness of the high-power function material is limited herein, and a specific limitation range is 2 nm to 200 nm.

In another aspect, this application further provides a chip, where the chip includes a substrate and the high electron mobility transistor that is disposed on the substrate and that is described in the foregoing embodiment.

In another aspect, this application further provides an electronic device. The electronic device includes a circuit board and a chip disposed on the circuit board, and the chip includes a substrate and the high electron mobility transistor that is disposed on the substrate and that is described in the foregoing embodiment.

In another aspect, this application further provides an electronic device. The electronic device includes a circuit board and the high electron mobility transistor that is disposed on the circuit board and that is described in the foregoing embodiment. It may be understood that, because the high electron mobility transistor has a high power density, a miniaturization design can be effectively implemented during design of the electronic device. In addition, high-gain performance of the high electron mobility transistor can greatly improve an information exchange speed or an operation speed of the electronic device, and reduce a reaction time.

According to the high electron mobility transistor provided in this application, the concentration of the two-dimensional electron gas in the corresponding channel layer below the field plate of the high electron mobility transistor is adjusted, so as to reduce a gate-drain capacitance, thereby improving the device gain of the high electron mobility transistor. In addition, the adjustment is only for a concentration of partial two-dimensional electron gas, and does not change a concentration of two-dimensional electron gas in the entire high electron mobility transistor, thereby ensuring high power density of the device.

BRIEF DESCRIPTION OF DRAWINGS

To describe the technical solutions in embodiments of this application or in the background, the following briefly describes the accompanying drawings for describing embodiments of this application or the background.

FIG. 5 is an example diagram of a third projection relationship between a field plate and a modulation region in a high electron mobility transistor according to this application;

FIG. 7 is an example schematic diagram of a structure of a high electron mobility transistor using barrier layer etching according to an embodiment of this application;

FIG. 9 is an example flowchart of manufacturing a high electron mobility transistor according to an embodiment of this application;

DESCRIPTION OF EMBODIMENTS

Figure 1:
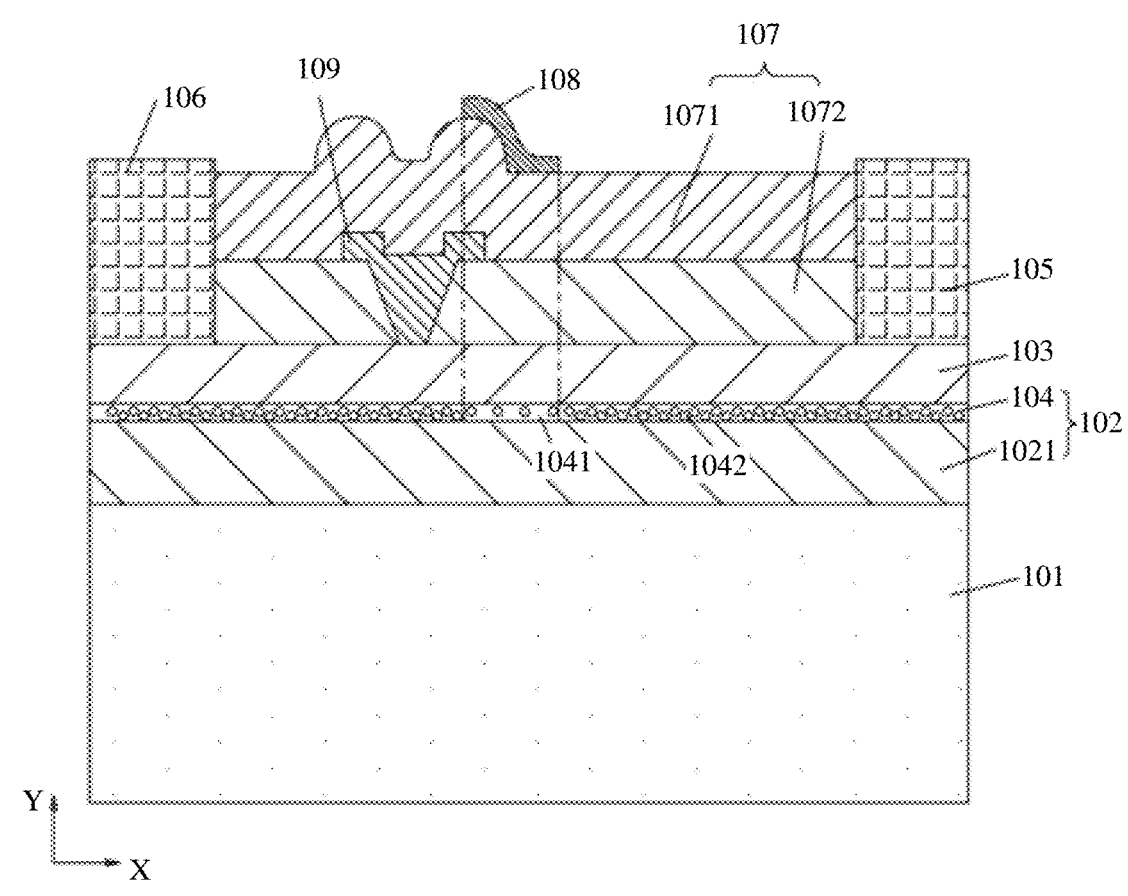
FIG. 1 is an example schematic diagram of a structure of a high electron mobility transistor according to an embodiment of this application.

To enable a person skilled in the art understand the solutions in this application better, the following describes the embodiments of this application with reference to the accompanying drawings in the embodiments of this application.

In the following detailed description, when an element such as a layer, a region, or a substrate is referred to as "on" another element, the element may be directly on the element, or an intermediate element may be disposed. In addition, relative terms such as "internal", "external", "upper", "lower", "inside", and "outside" and similar terms thereof are used to describe a relative relationship between one layer and another region in this specification.

In addition, the accompanying drawings provided with the present technology are merely schematic diagrams. It may be understood that, in an actual solution, dimensions represented by elements or structures of a product have relative dimensions different from those shown in the accompanying drawings in the specification. The embodiments of the present technology are not intended to limit a particular shape presented by each element or structure, and should further include a specific deviation caused by a manufacturing process. Therefore, the accompanying drawings are merely examples, and are not intended to limit the protection scope.

For ease of understanding, the following explains and describes related technical terms used in the embodiments of this application.

GaN substrate layer: The GaN substrate layer is mainly made of a GaN material. However, to obtain excellent device performance, the GaN substrate layer is further distinguished. The GaN substrate layer close to a substrate generally uses an AlGaN or GaN material, and may further use a GaN/AlGaN superlattice structure, which not only can withstand pressure, but also can control a stress change in an epitaxial process. Because high pressure needs to be borne, background carrier concentration needs to be reduced as much as possible in a growth process. Currently, a method used is carbon doping or iron doping. For iron doping, an extra iron source needs to be introduced, and iron has a severe memory effect. However, iron doping generally changes a growth parameter of a material slightly, and implements high-quality GaN epitaxial growth while ensuring high resistance. Carbon doping can adopt unintentional doping in the growth process, no additional carbon source is required, and there is no memory effect. However, the introduction of carbon needs to change a growth condition of the material, and therefore a high-resistance material is obtained at the expense of crystal quality. In order to reduce scattering of the high-resistance material on the two-dimensional electron gas and improve mobility of the device, a layer of high-quality intrinsic GaN material usually continues to be grown, and is used as a transport channel for the two-dimensional electron gas. The intrinsic GaN material has a thickness of about 100 to hundreds of nanometers. If the material is too thin, impact of the high-resistance GaN on the two-dimensional electron gas cannot be shielded. If the material is too thick, a breakdown characteristic of the device is affected. The high-resistance GaN and the intrinsic GaN together form the GaN substrate layer.

Barrier layer: The barrier layer plays a key role in an HEMT device. A thickness and a molar component of the barrier layer directly affect the concentration of two-dimensional electron gas in a channel. Generation of the two-dimensional electron gas mainly relies on piezoelectric polarization and spontaneous polarization of the GaN substrate layer and the barrier layer. A structure that can provide an electron barrier is called the barrier layer.

This application provides a high electron mobility transistor (HEMT device) and an electronic device including the high electron mobility transistor. The high electron mobility transistor is applied to an electronic device. Specifically, the high electron mobility transistor is disposed on a circuit board in the electronic device. In an implementation, the electronic device may be a communication device of an ultra-high-speed circuit such as a 5G base station, or the electronic device may be applied to another field, for example, a mobile terminal product, a new energy field, or a home network. Because the high electron mobility transistor has a high power characteristic, during product design, a size of the electronic device may be smaller under a same power effect. Similarly, because the high electron mobility transistor has relatively high gain performance, in an application scenario such as information exchange, an operation time can be reduced and a reaction rate can be improved for the electronic device.

Refer to FIG. 1. This application provides a high electron mobility transistor (HEMT device) 100, including a GaN substrate layer 102, a barrier layer 103, and a circuit layer that are sequentially stacked. The circuit layer includes a source 106, a drain 105, a dielectric layer 107, and a field plate 108 that are formed on the barrier layer 103. For ease of description, a first direction X and a second direction Y that are perpendicular to each other are defined herein. The first direction X is a direction on a surface of a substrate 101, extends between the source 106 and the drain 105, and is specifically a direction from left to right along the surface of the substrate 101 shown in FIG. 1. In other words, the first direction X is a direction in which the source 106 points to the drain 105 (which may be understood as a direction in which the source 106 points to the drain 105 at a position of a shortest distance between the source 106 and the drain 105). The second direction Y is perpendicular to the first direction X. Specifically, the second direction Y is a direction perpendicular to the surface of the substrate 101. It can be seen from FIG. 1 that, in the second direction Y, the GaN substrate layer 102, the barrier layer 103, and the dielectric layer 107 are sequentially stacked on the substrate 101.

In this embodiment, the GaN substrate layer 102 and the barrier layer 103 are formed on the substrate 101 in an epitaxial manner. The substrate 101 may be one of a silicon substrate, a diamond substrate, a sapphire substrate, or a silicon carbide substrate. The substrate 101 may be made of a single material, or may be made of a composite material (for example, the substrate 101 may include a silicon substrate layer and a sapphire substrate layer). The substrate 101 includes two opposite surfaces. As shown in FIG. 1, the substrate 101 includes a top surface and a bottom surface. In an implementation of this application, the top surface is used to make another layer structure, and the bottom surface may be an idle surface, or another layer structure may be made on the bottom surface.

The high electron mobility transistor provided in this application may not include the substrate 101. It may be understood that in an implementation, after other layer structures are fabricated on the substrate to form the high electron mobility transistor, the substrate may be removed, so as to implement a small-sized structure. The high electron mobility transistor provided in this application may be integrated on an additionally configured substrate to form a chip, and the chip may be disposed on a circuit board of an electronic device. In another implementation, the high electron mobility transistor provided in this application may alternatively be directly disposed on the circuit board of the electronic device.

In this application, the GaN substrate layer 102 and the barrier layer 103 are formed through growth in an epitaxial manner on the substrate 101. The epitaxial manner herein may be a metal-organic chemical vapor deposition (MOCVD) method, a molecular beam epitaxy (MBE) method, or the like. A thickness range of the GaN substrate layer 102 obtained through epitaxial processing in the second direction Y is 100 nm to 8000 nm, and a thickness range of the barrier layer 103 correspondingly obtained in the second direction Y is 2 nm to 50 nm. A material of the barrier layer herein may be a material such as aluminum gallium nitride, aluminum nitride, or indium gallium nitride. For ease of unified understanding, all descriptions of "thickness" or "depth" in the following are descriptions of a dimension in the second direction Y.

It may be learned that, in a process of forming the GaN substrate layer 102 and the barrier layer 103 in the epitaxial manner, a channel layer 104 is formed in the GaN substrate layer 102 at a boundary between the GaN substrate layer 102 and the barrier layer 103 due to piezoelectric polarization and spontaneous polarization of the material. Specifically, the GaN substrate layer 102 includes a main body layer 1021 and the channel layer 104, where the channel layer 104 is located at the boundary between the GaN substrate layer 102 and the barrier layer 103.

Two-dimensional electron gas (2DEG) 1042 that can move in the first direction X is distributed inside the channel layer 104. The two-dimensional electron gas 1042 herein may be understood as carriers, which are used for current conduction between the source 106 and the drain 105. Therefore, a concentration of the two-dimensional electron gas 1042 between the source 106 and the drain 105 determines power density of the entire high electron mobility transistor 100. If the concentration of the two-dimensional electron gas 1042 between the source 106 and the drain 105 decreases, that is, the carriers that can be used for conduction between the source 106 and the drain 105 are insufficient, the power density of the high electron mobility transistor 100 is reduced.

In this embodiment, the source 106 and the drain 105 are formed on the barrier layer 103 through photoetching and deposition. Specifically, structural patterns of the source 106 and the drain 105 may be first made through photoetching, and then metals such as titanium, aluminum, nickel, and gold are annealed at a high temperature (about 900 degrees) to obtain the source 106 and the drain 105 formed through deposition. It should be noted that, in a high-temperature annealing process, metal materials in the source 106 and the drain 105 penetrate into the barrier layer 103, to form an alloy structure, thereby implementing ohmic contact between the channel layer 104 and the source 106 as well as the drain 105.

The dielectric layer 107 disposed between the source 106 and the drain 105 is deposited by using an insulation medium such as silicon nitride, silicon oxide, or aluminum oxide. The dielectric layer 107 includes a first dielectric layer 1071 and a second dielectric layer 1072, and a gate 109 is disposed between the first dielectric layer 1071 and the second dielectric layer 1072. In this case, the gate 109 is also disposed between the source 106 and the drain 105 like the dielectric layer 107, and different voltages are applied to the gate 109 to control disconnection and conduction between the source 106 and the drain 105. Specifically, the gate 109 is formed on the first dielectric layer 1071. A gate groove corresponding to the gate 109 is first formed through photoetching and etching, and then a gate metal pattern is defined through photoetching. After metal is deposited, the gate 109 may be formed. In this embodiment, a gate length range of the gate 109 in the first direction X is 10 nm to 5000 nm.

After the gate 109 is made through photoetching and metal deposition, the second dielectric layer 1072 may be obtained by performing secondary deposition of an insulation medium. A method for secondary deposition of the insulation medium includes but is not limited to plasma chemical vapor deposition, atomic deposition, low-pressure chemical vapor deposition, and the like. A size of the second dielectric layer 1072 obtained through deposition in the second direction Y is 50 nm to 1000 nm.

In this embodiment, as shown in FIG. 1, the field plate 108 is disposed on the dielectric layer 107. A design of the field plate 108 is to adjust an electric field of the dielectric layer 107 and a region below the dielectric layer 107, reduce a peak electric field effect of the device in an off state, and improve stability of the entire device. It may be learned that, the channel layer 104 includes a modulation region 1041 that overlaps a projection region below the field plate 108.

It can be seen from FIG. 1 that, a region projected downward by the field plate 108 along the second direction Y at least partially overlaps the modulation region 1041 in the channel layer 104. Herein, at least partially overlapping means that the region projected downward by the field plate 108 along the second direction Y has an intersection with the modulation region 1041, and the intersection may be a part or all of the projection region of the field plate 108, or may be a part or all of the modulation region 1041. An innovation point of this application is to adjust a concentration of two-dimensional electron gas 1042 in the modulation region 1041, so that the concentration of the two-dimensional electron gas 1042 in the modulation region 1041 is less than a concentration of two-dimensional electron gas 1042 in another region of the channel layer 104. It may be understood that, after the concentration of the two-dimensional electron gas 1042 in the modulation region 1041 is reduced, the corresponding two-dimensional electron gas in the corresponding region below the field plate 108 is easily depleted, and in this case, a parasitic capacitance is correspondingly reduced. The decrease of parasitic capacitance shortens charging and discharging times of the device, and increases a gain of the device. In this application, the adjustment of the concentration of the two-dimensional electron gas 1042 in the channel layer 104 is only for the modulation region 1041, that is, the projection region below the field plate 108, and is a local adjustment. Therefore, the concentration of the two-dimensional electron gas 1042 in the entire channel layer 104 does not change greatly. In this way, it is ensured that a transmission capability of carriers (two-dimensional electron gas 1042) between the source 106 and the drain 105 is not affected, and a current conduction capability between the source 106 and the drain 105 remains unchanged, that is, the high electron mobility transistor 100 still maintains high power density.

Specifically, a concentration range of the two-dimensional electron gas 1042 in the modulation region 1041 is $10^{12}/cm^2$ to $10^{13}/cm^2$. The two-dimensional electron gas 1042 may be understood as electrons that move between the source 106 and the drain 105 in the first direction X, and is a separation phenomenon of electrons from ionization donors due to injection of electrons in the barrier layer 103 into potential hydrazine on a surface of the GaN substrate layer 102. The electrons in the potential hydrazine can only move in a direction parallel to a channel (a thin semiconductor layer between the source 106 and the drain 105) (the first direction X motion), forming a conduction current between the source 106 and the drain 105.

Figure 2:
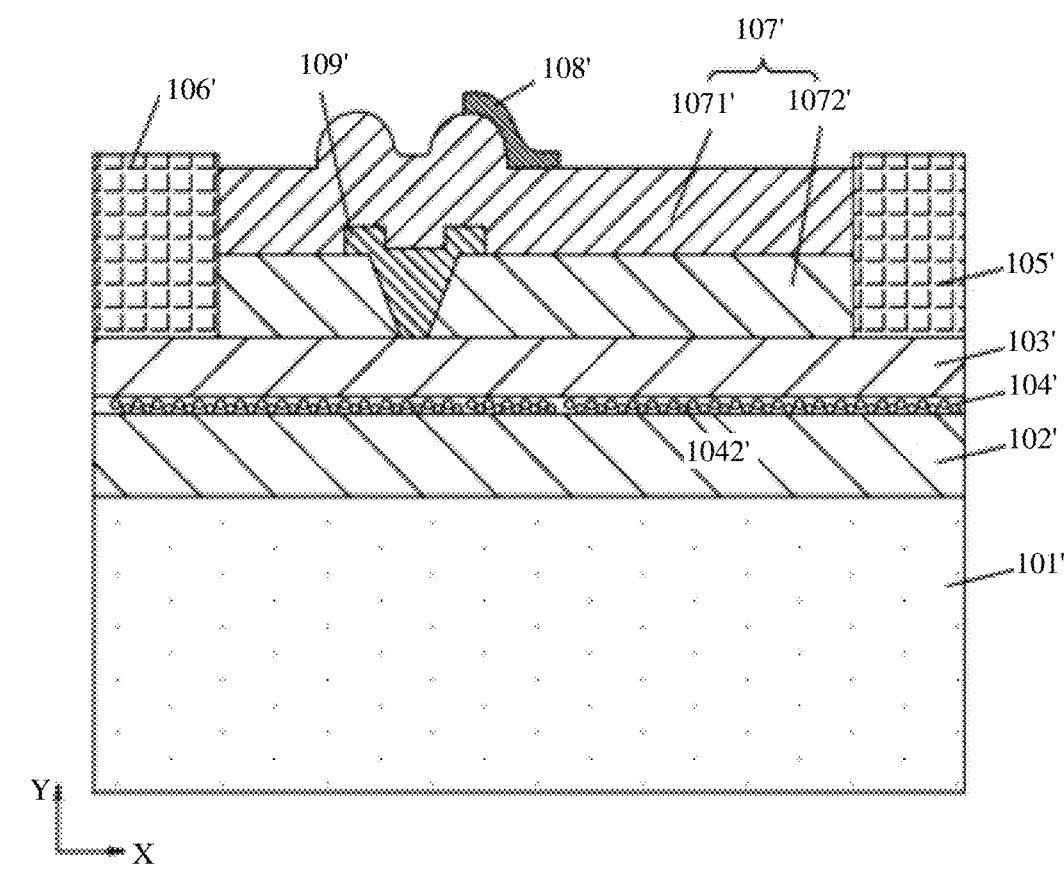
FIG. 2 is an example schematic diagram of a structure of a high electron mobility transistor in the current technology.

As shown in FIG. 2, in a conventional design of a high electron mobility transistor 100', a concentration of two-dimensional electron gas in an entire channel layer 104' remains about $10^{13}/cm^2$. Under this concentration, a connection and disconnection effect of a current between a source 106' and a drain 105' can be ensured. However, the two-dimensional electron gas 1042' of this concentration causes an increase in a parasitic capacitance in a corresponding modulation region 1041' below a field plate 108', and indirectly increases charging and discharging times of the parasitic capacitor, thereby reducing a device gain of the high electron mobility transistor 100'. Specifically, in this embodiment, as shown in FIG. 1, the concentration range of the two-dimensional electron gas 1042 in the modulation region 104 is $10^{12}/cm^2$ to $10^{13}/cm^2$. The two-dimensional electron gas 1042 within the concentration range does not affect a current conduction capability between the source 106 and the drain 105, and reduces the parasitic capacitance, so that the device gain of the high electron mobility transistor 100 is improved.

Figure 3:
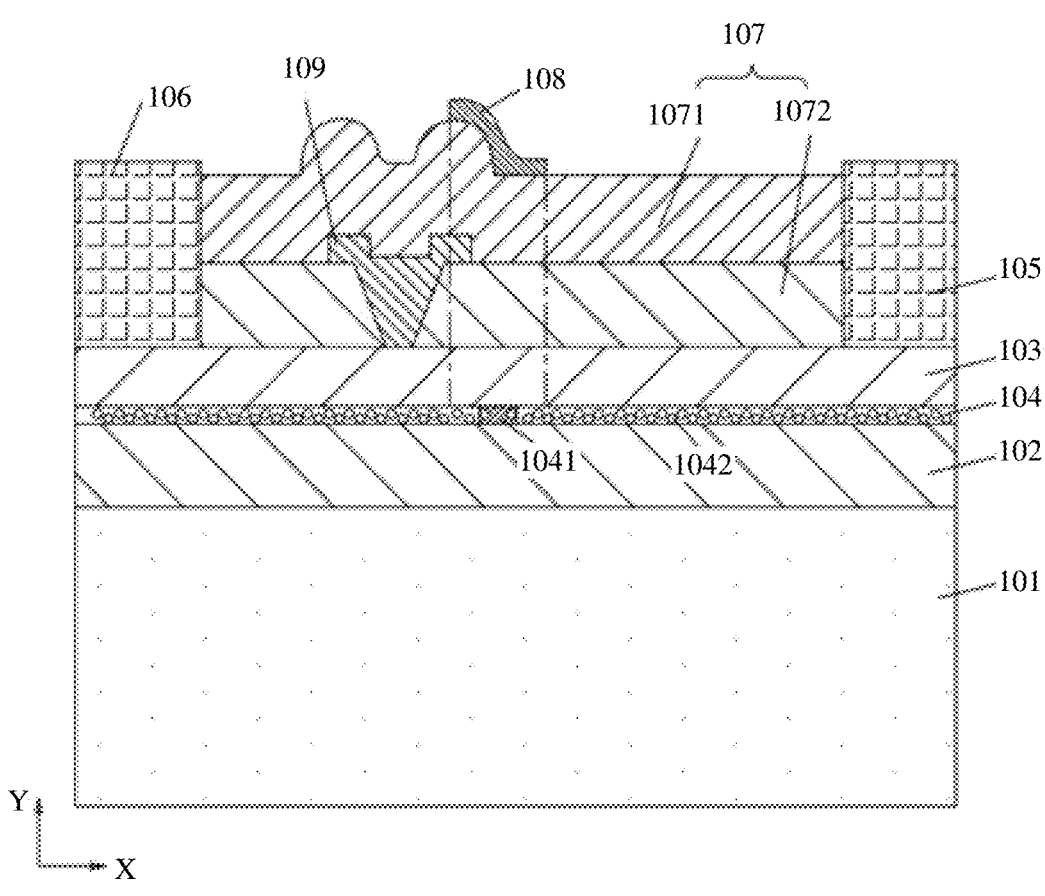
FIG. 3 is an example diagram of a first projection relationship between a field plate and a modulation region in a high electron mobility transistor according to this application.
Figure 4:
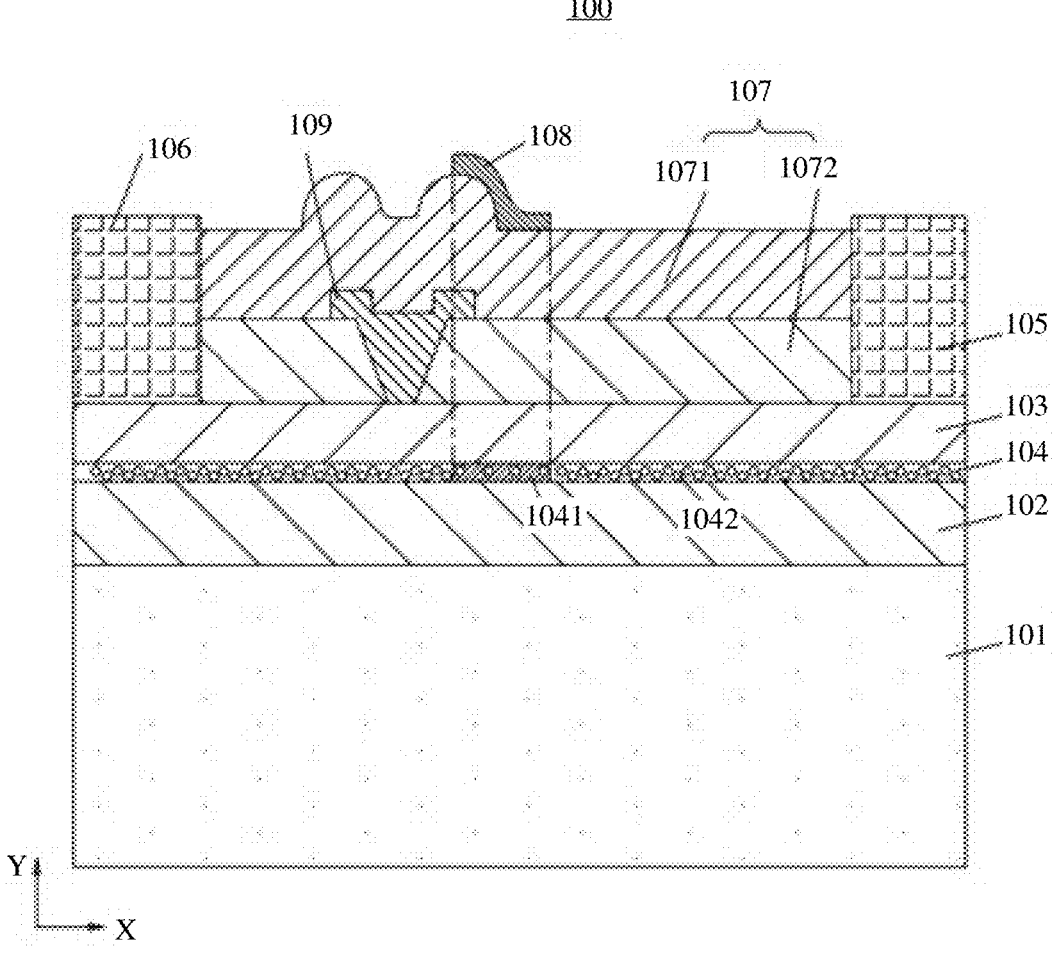
FIG. 4 is an example diagram of a second projection relationship between a field plate and a modulation region in a high electron mobility transistor according to this application.
Figure 5:
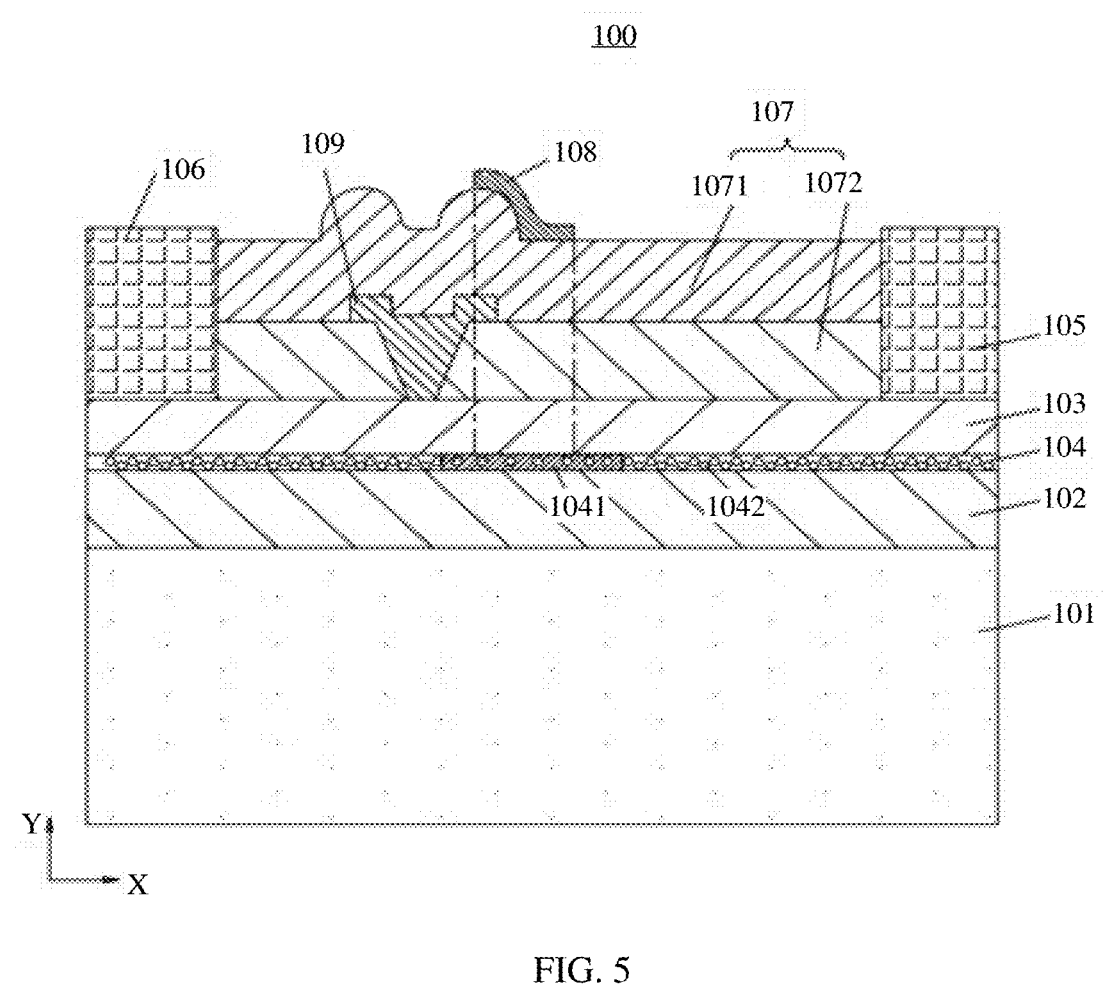

Refer to FIG. 3, FIG. 4, and FIG. 5 together. An area of the modulation region 1041 in this embodiment accounts for 5% to 200% of an area of the projection region below the field plate 108. As shown in FIG. 3, FIG. 4, and FIG. 5, the region of downward projection of the field plate 108 along the second direction Y herein has an overlapping part with the modulation region 1041. For different embodiments, a difference lies in an area of the overlapping part and a size of the field plate 108.

The following uses three cases for description. As shown in FIG. 3, in this case, the modulation region 1041 is completely covered by the region of downward projection of the field plate 108 along the second direction Y, that is, the modulation region occupies only a part of the projection region. In an extreme case, the area of the modulation region 1041 accounts for 5% of the area of the projection region below the field plate. As shown in FIG. 4, in this case, the modulation region 1041 and the region of downward projection of the field plate 108 along the second direction Y completely overlap, that is, the projection region below the field plate 108 is the modulation region 1041. In this case, the area of the modulation region 1041 accounts for 100% of the area of the projection region below the field plate. As shown in FIG. 5, in this case, the modulation region 1041 fully covers the region of downward projection of the field plate 108 along the second direction Y, that is, the projection region occupies only a part of the modulation region 1041. In this case, the area of the modulation region 1041 accounts for 200% of the area of the projection region below the field plate 108.

It may be understood that, when the high electron mobility transistor 100 is being designed, a position and a size of the field plate 108 have been determined, and only a position and a size of the modulation region 104 need to be determined based on the foregoing requirements and based on the position and the size of the field plate 108. It can be imagined that, if the area of the modulation region 1041 is excessively small, improvement to the parasitic capacitance is not obvious, and a device gain is not high; if the area of the modulation region 1041 is excessively large, the concentration of the two-dimensional electron gas 1042 in the entire channel layer 104 is obviously reduced, and in this case, ohmic contact performance of the source 106 and the drain 105 is affected, thereby reducing power density of the device.

To better describe how the two-dimensional electron gas 1042 in the modulation region 104 is adjusted in the solution of this application, the following uses three specific implementations for description.

Figure 6:
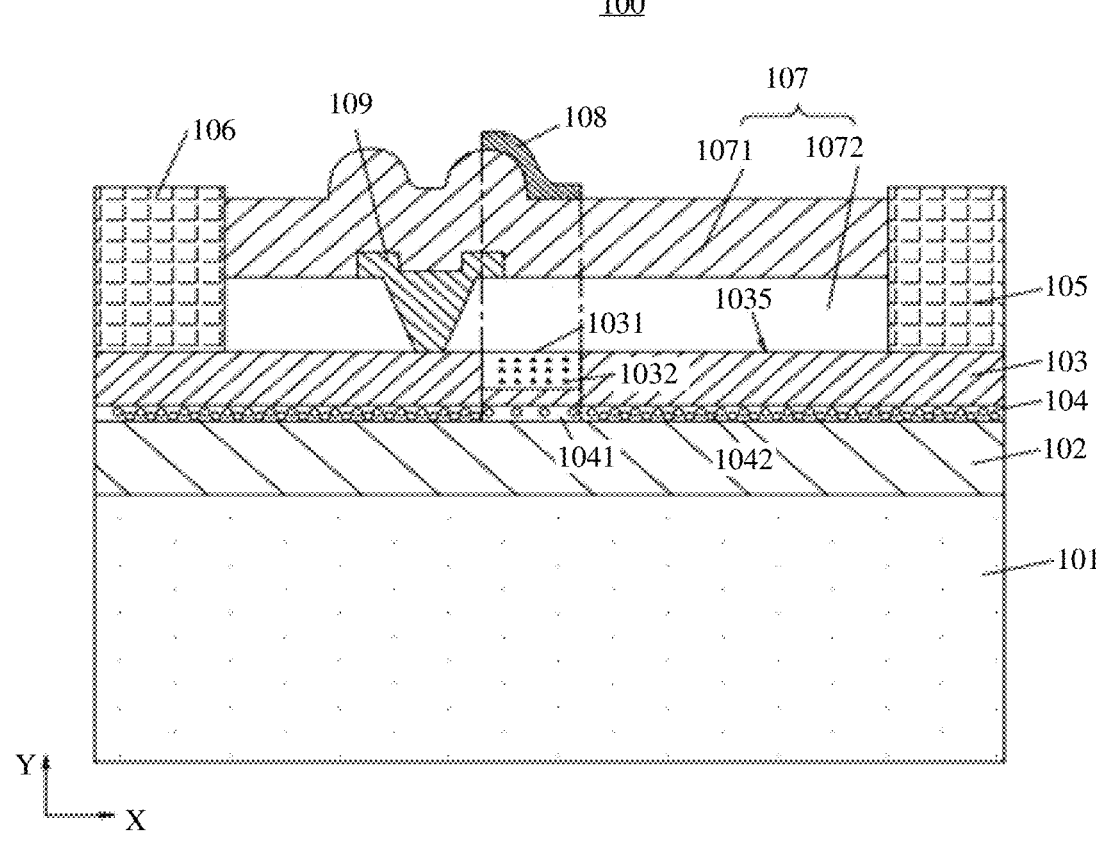
FIG. 6 is an example schematic diagram of a structure of a high electron mobility transistor using fluorine ion injection according to an embodiment of this application.

FIG. 6 shows a first possible implementation of adjusting the two-dimensional electron gas 1042 in the modulation region 104. In this embodiment, the barrier layer 103 includes a fluorine ion injection region 1031. The fluorine ion 1032 injection region 1031 is a projection region of the modulation region 1041 on the barrier layer 103, and a projection direction is the second direction Y. In this embodiment, the fluorine ions 1032 are injected from a surface 1035 on a side that is of the barrier layer 103 and that is away from the GaN substrate layer 102. The injection region is referred to as a fluorine ion injection region 1031. In this case, the projection region of the modulation region 1041 on the barrier layer 103 is the injection region (the fluorine ion injection region 1031). It may be understood that, when fluorine ions are injected into the barrier layer 103, the negatively charged fluorine ions 1032 absorb free electrons inside the barrier layer 103, and the two-dimensional electron gas 1042 corresponding to the modulation region 1041 is depleted by the negatively charged fluorine ions, thereby reducing the concentration of the two-dimensional electron gas 1042 in the modulation region 1041.

Specifically, an injection depth of the fluorine ion injection region 1031 is 1 nm to 100 nm, and an injection concentration is $10^{12}/cm^2$ to $10^{15}/cm^2$. In this embodiment, a thickness of the barrier layer 103 is usually 2 nm to 50 nm, and a thickness of the GaN substrate layer 102 is 100 nm to 8000 nm. The fluorine ions are injected, towards the GaN substrate layer 102, to the surface 1035 from the side that is of the barrier layer 103 and that is away from the GaN substrate layer. The depth herein is a distance between the fluorine ions 1032 and the injection surface 1035 of the barrier layer 103.

Because the channel layer 104 is formed at the boundary between the barrier layer 103 and the GaN substrate layer 102, and is accurately located inside the GaN substrate layer 102, to ensure that the injected fluorine ions 1032 can affect the concentration of the two-dimensional electron gas 1042 in the modulation region 1041, the injection depth needs to be close to the channel layer 104. For example, when the thickness of the barrier layer 103 is 2 nm, the injection depth of the fluorine ions 1032 needs to reach 1 nm, so that the two-dimensional electron gas 1042 below the barrier layer 103 is affected to some extent.

However, the injection depth of the fluorine ions 1032 cannot exceed a specific limit. For example, the thickness of the barrier layer is 50 nm. In this case, the injection depth of the fluorine ions may reach 100 nm. It may be understood that in this case, the injection depth of the fluorine ions extends to the GaN substrate layer, that is, fluorine ions 1032 are injected into a part of the GaN substrate layer 102. For injection of this depth, the concentration of the two-dimensional electron gas 1042 in the modulation region 104 is greatly reduced, and the corresponding parasitic capacitance is also greatly reduced. In this case, the gain of the device reaches the maximum. In addition, because the concentration of the two-dimensional electron gas 1042 in the modulation region is reduced, the concentration of the two-dimensional electron gas 1042 in the entire channel layer 104 is inevitably affected, that is, the power density of the device is reduced. Therefore, a depth of injection of fluorine ions should not exceed 100 nm; otherwise, the power density of the entire high electron mobility transistor 100 is obviously affected.

Similarly, there is also a specific limitation on an injection concentration of fluorine ions 1032, and a specific range is $10^{12}/cm^2$ to $10^{15}/cm^2$. If the injection concentration of fluorine ions is greater than $10^{15}/cm^2$, the concentration of the two-dimensional electron gas 1042 is reduced too much, thereby affecting the power density of the high electron mobility transistor 100. If the injection concentration of fluorine ions 1032 is less than $10^{12}/cm^2$, the concentration of the two-dimensional electron gas 1042 in the modulation region 1041 does not change obviously, the corresponding parasitic capacitance does not decrease, and the device gain of the high electron mobility transistor 100 does not increase.

Figure 7:
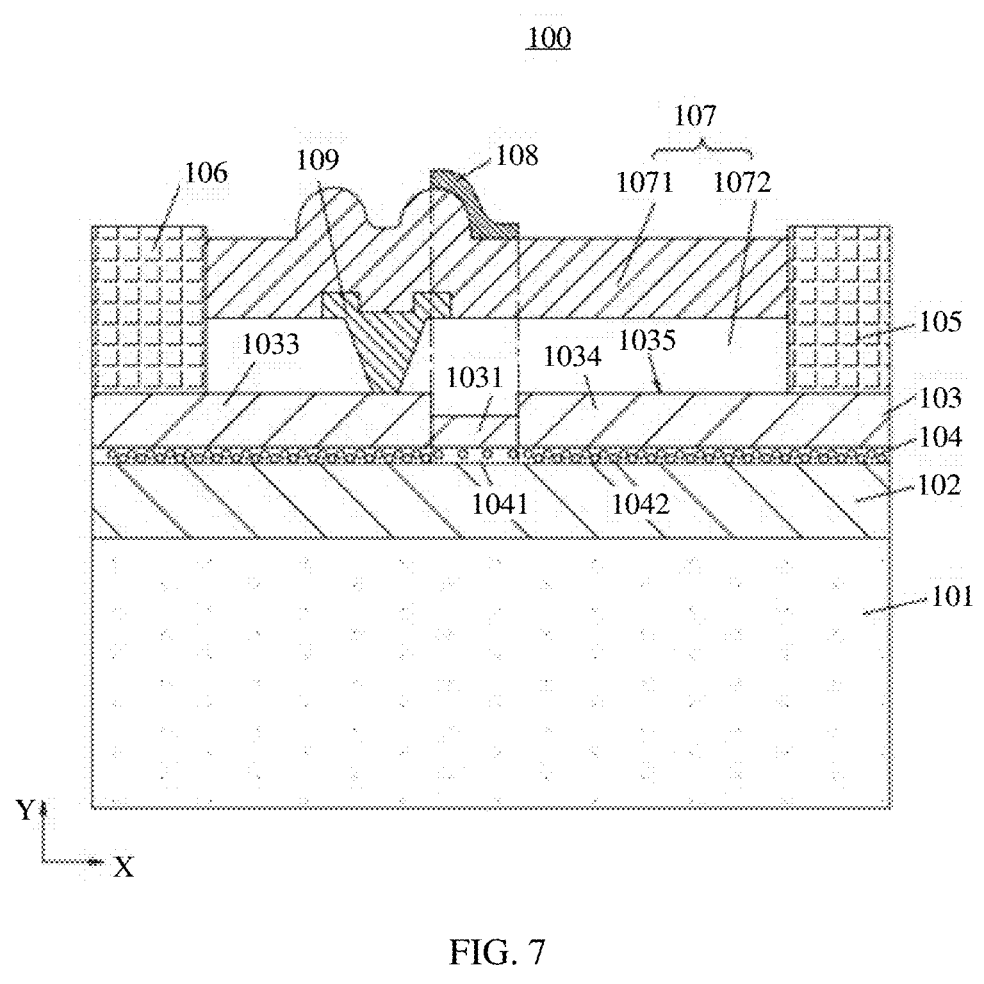
Figure 12:
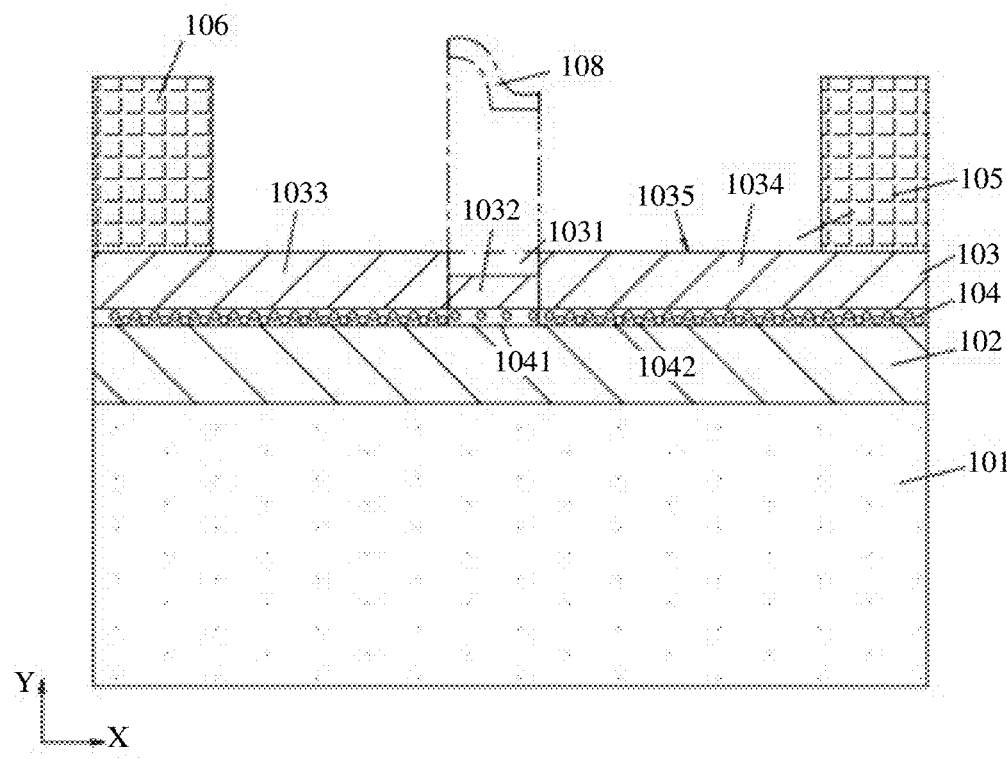
FIG. 12 is an example schematic diagram of step S130 of a manufacturing method for a high electron mobility transistor according to a second embodiment of this application.

FIG. 7 and FIG. 12 show a second possible implementation of adjusting the two-dimensional electron gas 1042 in the modulation region 1041. In this embodiment, the barrier layer 103 is provided with a groove 1031, a groove opening of the groove 1031 is provided on a surface 1035 that is of the barrier layer 103 and that faces the dielectric layer 107 (specifically, the first dielectric layer 1071), the groove 1031 is filled with the dielectric layer 107, and a projection region of the modulation region 104 on the barrier layer 103 overlaps the groove 1031. In other words, the groove 1031 is formed on a surface that is of the barrier layer 103 and that is away from the GaN substrate layer 102. Before the dielectric layer 107 is manufactured, the groove 1031 is first formed. In a process of manufacturing the dielectric layer 107, the groove 1031 is directly filled with a material of the dielectric layer 107.

Specifically, the barrier layer 103 includes a first part 1032, a second part 1033, and a third part 1034. The first part 1032 is located between the second part 1033 and the third part 1034, a thickness of the first part 1032 is less than a thickness of the second part 1033 and a thickness of the third part 1034, and the first part 1032 forms a groove 1031 between the second part 1033 and the third part 1034, where a part of the dielectric layer 107 is in the groove 1031. The groove 1031 is a projection region of the modulation region 1041 on the barrier layer 103 along the second direction Y. The groove 1031 herein may be obtained by processing the surface 1035 through dry etching or wet etching. It may be understood that the projection region of the modulation region 1041 on the barrier layer 103 is an etched region on the surface 1035, that is, the groove 1031. The barrier layer 103 corresponding to the groove 1031 is etched, formation of a heterojunction in the channel layer 104 is closely related to the barrier layer 103 and the GaN substrate layer 102. A thickness of the barrier layer 103 determines the concentration of the two-dimensional electron gas 1042 in the channel layer 104. It should be noted that the concentration of the two-dimensional electron gas 1042 herein is in a dynamic change process. When the thickness of the barrier layer 103 becomes lower, the concentration of the corresponding two-dimensional electron gas 1042 also decreases. Therefore, when the groove 1031 is disposed on the barrier layer 103, the channel layer 104 corresponding to the groove 1031 is affected, and the groove 1031 corresponds to the modulation region 1041, and the concentration of the two-dimensional electron gas 1042 in the corresponding modulation region 1041 decreases.

In an etching manner, a structure of the channel layer 104 between the original barrier layer 103 and the GaN substrate layer 102 is damaged, so as to change a concentration of two-dimensional electron gas 1042 in a corresponding region (the modulation region 1041). It can be learned that this adjustment is a local damage to the structure of the channel layer 104, and affects only the concentration of the two-dimensional electron gas 1042 in the modulation region 1041 corresponding to the groove 1031. Therefore, this design is aimed at reducing the concentration of the two-dimensional electron gas in the modulation region 1041, and improving the device gain of the device by reducing the parasitic capacitance. In addition, this design also ensures a current conduction capability between the source 106 and the drain 105, so that the high electron mobility transistor 100 has high power density.

Specifically, as shown in FIG. 7, an etching depth of the groove 1031 in the second direction Y is 2 nm to 50 nm. It may be understood that the groove 1031 is formed on the barrier layer 103, and a thickness range of the barrier layer 103 is 1 nm to 50 nm. Therefore, for the groove 1031, an etching depth range is limited to 1 nm to 50 nm, that is, 2 nm to 50 nm in this solution.

Figure 8:
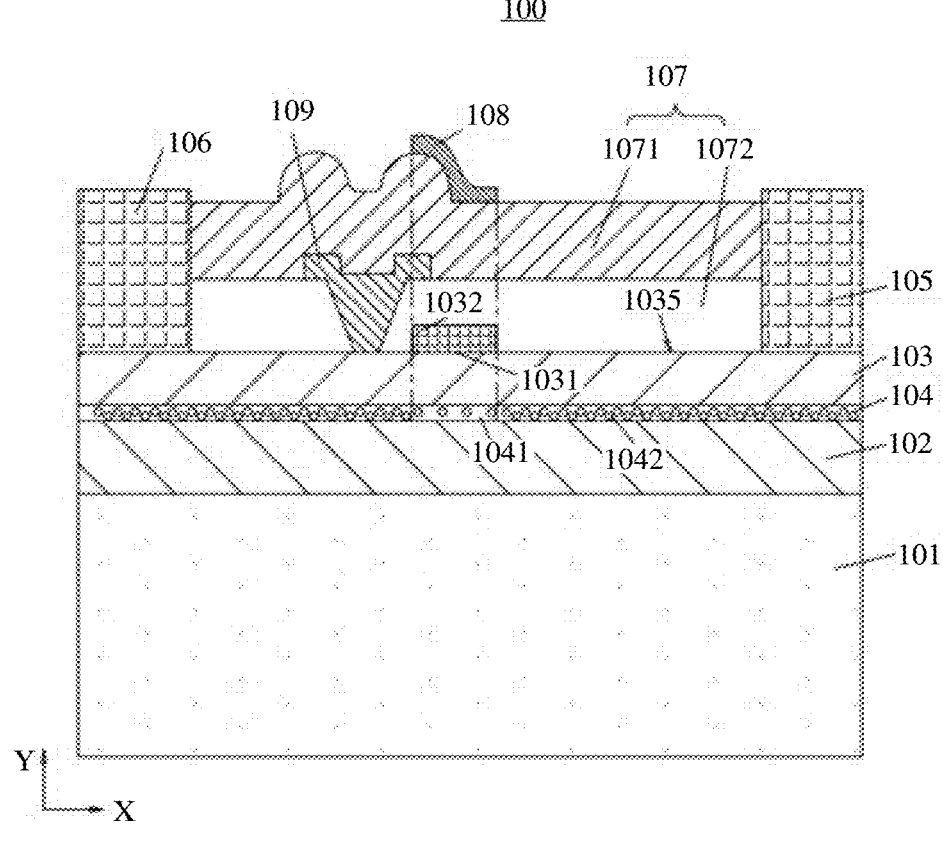
FIG. 8 is an example schematic diagram of a structure of a high electron mobility transistor using high-power function material growing according to an embodiment of this application.

FIG. 8 shows a third possible implementation of adjusting the two-dimensional electron gas 1042 in the modulation region 1041. In this embodiment, a growth region 1031 is disposed on a surface 1035 that is of the barrier layer 103 and that faces the dielectric layer 107, and the growth region 1031 is a projection region of the modulation region 1041 on the barrier layer 103. The growth region 1031 is configured to grow a high-power function material 1032. The high-power function material 1032 herein may be a P-type semiconductor, nickel oxide, metal, or the like. After the high-power function material 1032 grows on the barrier layer 103, the high-power function material 1032 and the barrier layer 103 tend to be in an electron balance state. Implementation of the electron balance state consumes surrounding two-dimensional electron gas 1042, that is, reduces the concentration of the two-dimensional electron gas 1042 in the corresponding modulation region 1041. In this embodiment, the high-power function material 1032 grows in the projection region (the growth region 1031) of the modulation region 1041 on the barrier layer 103, so that the concentration of the two-dimensional electron gas 1042 in the modulation region 1041 can be correspondingly reduced. In this manner of growing the high-power function material 1032 in a specific region, a concentration of two-dimensional electron gas 1042 in a specific region of the channel layer 104 can be adjusted in a targeted manner, without reducing the concentration of the two-dimensional electron gas 1042 in the entire channel layer 104. It can be imagined that, in a manner of growing the high-power function material 1032, the concentration of the local two-dimensional electron gas 1042 is reduced in a targeted manner, which not only reduces the parasitic capacitance, but also improves the device gain of the device and ensures a current conduction capability between the source 106 and the drain 105, so that the high electron mobility transistor 100 has high power density.

Specifically, as shown in FIG. 8, in this embodiment, a thickness of the high-power function material 1032 in the growth region 1031 is 2 nm to 200 nm. The thickness of the high-power function material 1032 in the growth region 1031 determines a concentration of consumed two-dimensional electron gas. It may be understood that a higher thickness of the high-power function material 1032 indicates a lower concentration of the two-dimensional electron gas 1042 in the modulation region 1041. If the thickness of the high-power function material 1032 is less than 2 nm, the concentration of the two-dimensional electron gas 1042 in the modulation region 1041 does not change obviously, and the device gain of the high electron mobility transistor 100 does not increase. If the thickness of the high-power function material 1032 is greater than 200 nm, the concentration of the two-dimensional electron gas 1042 in the corresponding modulation region 1041 is greatly affected (reduced). In this case, the power density of the high electron mobility transistor 100 is reduced. Therefore, the upper and lower limits of the thickness of the high-power function material 1032 are limited herein, to ensure that the high electron mobility transistor 100 can have both a high device gain and high power density in the solution of growing the high-power function material 1032.

Figure 10A:
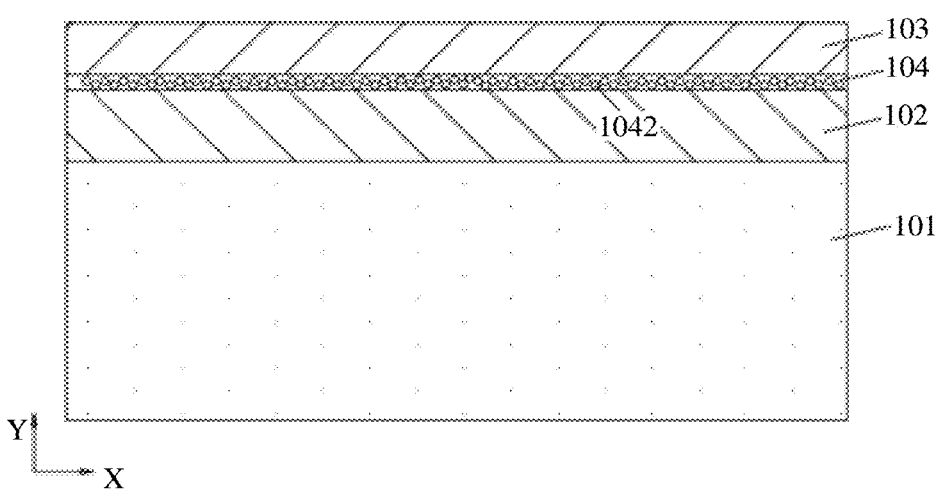
FIG. 10a to FIG. 10e are example process diagrams of manufacturing a high electron mobility transistor according to an embodiment of this application.

In another aspect, as shown in FIG. 9, this application further provides a manufacturing method for a high electron mobility transistor, and specific steps include:

S110: Form a GaN substrate layer 102 and a barrier layer 103 on a substrate 101 in an epitaxial manner, where the GaN substrate layer 102 includes a channel layer 104, as shown in FIG. 10a.

Generally, a material such as silicon carbide, silicon, sapphire, or diamond is used as the substrate 101 herein, and the selected epitaxial manner may be metal-organic chemical vapor deposition or molecular beam epitaxy. In this embodiment, epitaxial processing is performed on the substrate 101 to obtain the GaN substrate layer 102 whose thickness ranges from 100 nm to 8000 nm and the barrier layer 103 whose thickness ranges from 2 nm to 50 nm. It may be understood that, at a boundary between the GaN substrate layer 102 and the barrier layer 103, a channel layer 104 is formed in a region that is in the GaN substrate layer 102 and that is close to the barrier layer 103 due to heterogeneity reaction caused by epitaxial processing, and the channel layer 104 includes two-dimensional electron gas 1042 that can move in a first direction X.

Figure 10B:
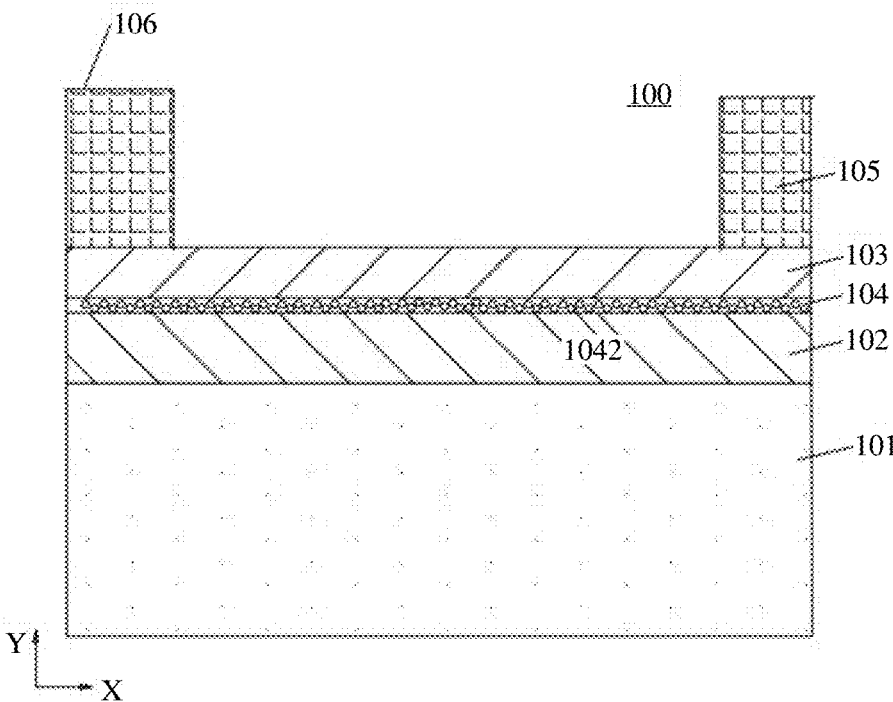

S120: Dispose a source 106 and a drain 105 on the barrier layer 103, as shown in FIG. 10b.

In a manufacturing process, structural patterns of the source 106 and the drain 105 are first manufactured in a photoetching manner, and then the source 106 and the drain 105 are formed in a metal deposition manner. Specifically, the source 106 and the drain 105 may be formed by depositing a plurality of layers of metal, for example, 890° C. high-temperature annealing is performed on metal such as titanium/aluminum/nickel/gold (30 nm/130 nm/50 nm/150 nm) for 30 s, to form alloy metal.

Figure 10C:
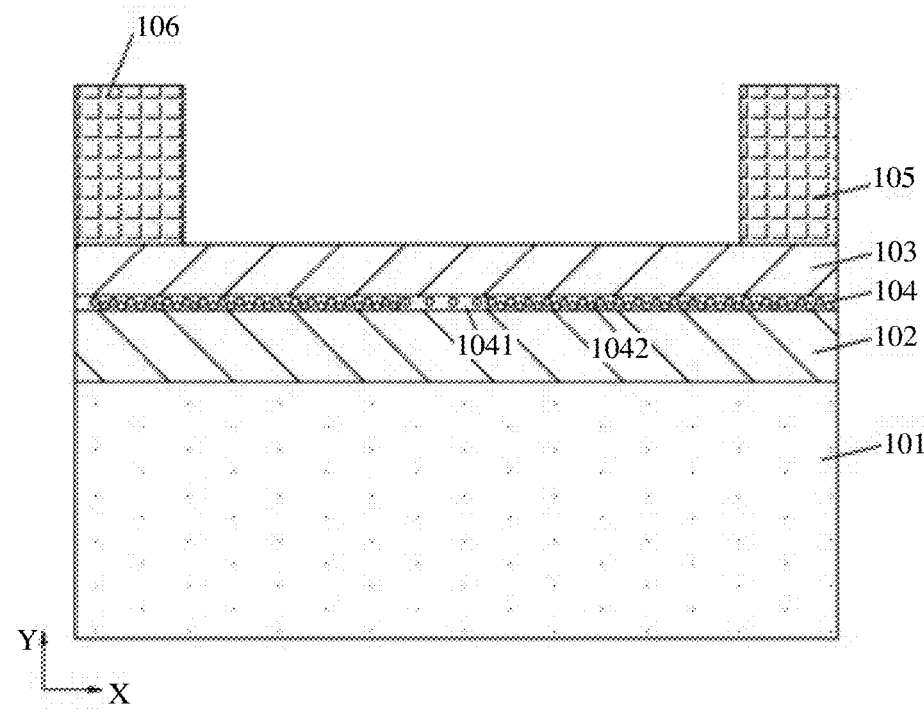

S130: Determine a position of a modulation region 1041 in the channel layer 104, and reduce a concentration of two-dimensional electron gas 1042 in the modulation region 1041 of the channel layer 104, where the position of the modulation region 1041 at least partially overlaps a projection of a preset position of a field plate 108 on the channel layer 104, as shown in FIG. 10c.

During subsequent manufacturing of the entire high electron mobility transistor 100, the field plate 108 is formed to adjust charge distribution in a dielectric layer 107. Therefore, before the high electron mobility transistor 100 is manufactured, positions of related components (for example, the field plate 108) are arranged in advance. It may be understood that a preset position of the field plate 108 may be determined through the arrangement in advance. In this way, processing is performed in a projection region of the preset position of the field plate 108 on the channel layer 104. A specific processing operation is to reduce a concentration of two-dimensional electron gas 1042 in the channel layer 104 in a corresponding region. Herein, the region in which the concentration of the two-dimensional electron gas 1042 is reduced is defined as the modulation region 1041. It may be understood that the modulation region 1041 overlaps the projection region below the preset position of the field plate 108. By reducing the concentration of the two-dimensional electron gas 1042 in the projection region below the preset position of the field plate 108, electric field distribution in a depletion region below the field plate 108 is changed, thereby reducing a parasitic capacitance and improving a component gain.

In step S130, there are a plurality of specific operations for reducing the concentration of the two-dimensional electron gas in the modulation region 1041. A first manner is to perform fluorine ion injection. A second manner is to partially etch the barrier layer 103. A third manner is to grow a high-power function material on the barrier layer 103. The following is described by using three specific implementations.

Figure 11:
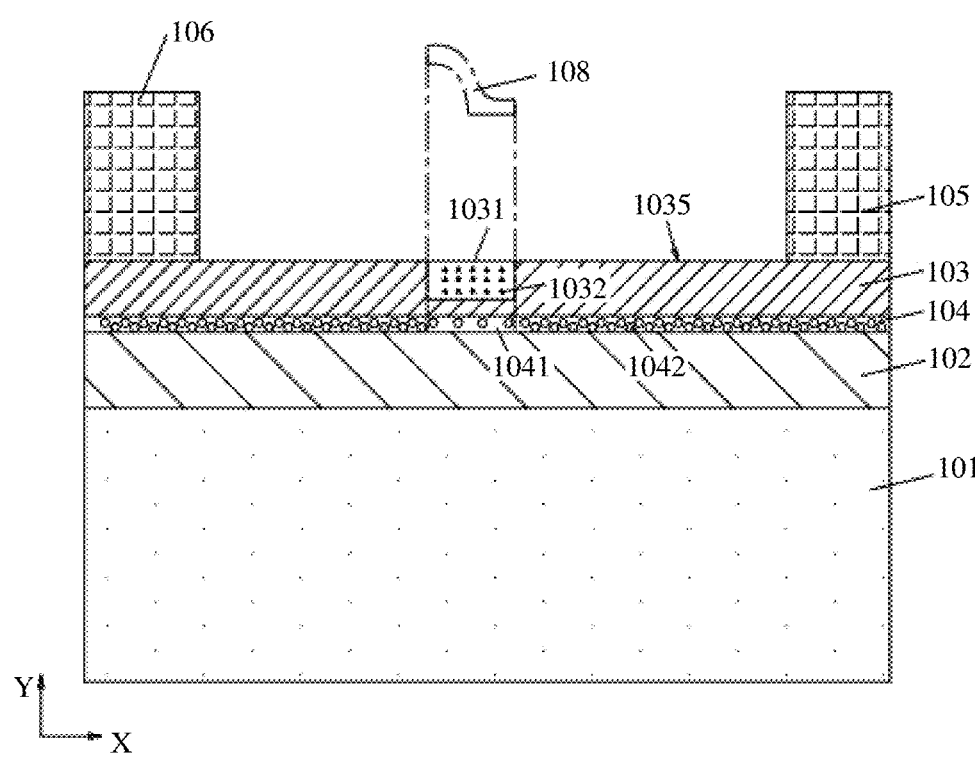
FIG. 11 is an example schematic diagram of step S130 of a manufacturing method for a high electron mobility transistor according to a first embodiment of this application.

As shown in FIG. 11, in the first method for reducing the concentration of the two-dimensional electron gas 1042, a specific operation of step S130 is: injecting fluorine ions into the barrier layer 103, where a region in which the fluorine ions are injected is a projection region of the modulation region 1041 on the barrier layer 103, that is, an injection region 1031. It may be understood that, after the fluorine ions are injected into the barrier layer 103, the fluorine ions deplete nearby two-dimensional electron gas 1042, and therefore, the concentration of the two-dimensional electron gas 1042 in the modulation region 1041 corresponding to the injection region 1031 is reduced. The modulation region 1041 is located below the preset position of the field plate 108. Therefore, after the field plate 108 is formed, the concentration of the two-dimensional electron gas 1042 below the field plate 108 is changed, and correspondingly the depletion region of the dielectric layer 107 below the field plate 108 is changed, so that the parasitic capacitance becomes smaller. In this way, the device gain of the entire high electron mobility transistor 100 can be improved. In addition, the fluorine ions are injected only into the injection region 1031 on the barrier layer 103, but not into the entire barrier layer 103. Therefore, the correspondingly changed concentration of the two-dimensional electron gas 1042 is specific to the modulation region 1041 corresponding to the injection region 1031. It may be understood that, the method for locally changing the concentration of the two-dimensional electron gas 1042 does not affect motion of the two-dimensional electron gas 1042 in the entire channel layer 104 in the first direction X, that is, does not affect a current conduction capability between the source 106 and the drain 105, which ensures that power density of the high electron mobility transistor 100 is not reduced.

In the foregoing fluorine ion injection process, it should be noted that, the fluorine ion injection region 1031 is at the barrier layer 103, and the corresponding modulation region 1041 is at the channel layer 104. Because the fluorine ions are injected into the injection region 1031 at the barrier layer 103, the concentration of the two-dimensional electron gas 1042 in the modulation region 1041 is reduced, the modulation region 1041 herein is a projection region of the injection region 1031 in a second direction Y, and the two regions completely overlap, which is different from the projection region below the field plate 108. In a specific embodiment, although the modulation region 1041 is also located below the field plate 108, the modulation region 1041 and the projection region below the field plate 108 do not completely overlap. A relationship between the modulation region 1041 and the projection region below the field plate 108 may be that an area of the modulation region 1041 accounts for 5% to 200% of an area of the projection region below the field plate 108. In other words, an area of the fluorine ion injection region 1031 accounts for 5% to 200% of the area of the projection region below the field plate 108.

FIG. 3 to FIG. 5 show three possible cases. As shown in FIG. 3, in this case, the modulation region 1041 (the injection region 1031) is completely covered by the region of downward projection of the field plate 108 along the second direction Y, that is, the modulation region 1041 occupies only a part of the projection region. In an extreme case, the area of the modulation region 1041 accounts for 5% of the area of the projection region below the field plate. As shown in FIG. 4, in this case, the modulation region 1041 (the injection region 1031) and the region of downward projection of the field plate 108 along the second direction Y completely overlap, that is, the projection region below the field plate 108 is the modulation region. In this case, the area of the modulation region accounts for 100% of the area of the projection region below the field plate. As shown in FIG. 5, in this case, the modulation region 1041 (the injection region 1031) fully covers the region of downward projection of the field plate 108 along the second direction Y, that is, the projection region occupies only a part of the modulation region 1041. In this case, the area of the modulation region 1041 accounts for 200% of the area of the projection region below the field plate 108.

In an implementation, when fluorine ion injection is performed on the injection region 1031, it should be noted that an injection depth of the fluorine ions is 1 nm to 100 nm, and an injection concentration is $10^{12}/\mathrm{cm}^2$ to $10^{15}/\mathrm{cm}^2$. It may be understood that, the fluorine ions are injected from the surface 1035 of the barrier layer 103. Generally, a thickness of the barrier layer 103 is 2 nm to 50 nm, and a thickness of the GaN substrate layer 102 is 100 nm to 8000 nm. For fluorine ion injection, the fluorine ions are injected, towards the GaN substrate layer 102, to the surface 1035 from a side that is of the barrier layer 103 and that is away from the GaN substrate layer. The depth herein refers to a distance between the fluorine ions 1032 and the injection surface 1035 of the barrier layer 103. If the injection depth exceeds 100 nm, the concentration of the two-dimensional electron gas 1042 in the entire modulation region 1041 is affected, the current conduction capability between the source 106 and the drain 105 is reduced, thereby resulting in reduced power density of the high electron mobility transistor 100. Similarly, a selection of the fluorine ion injection concentration also directly affects the concentration of the two-dimensional electron gas 1042 in the corresponding modulation region 1041. If the concentration is excessively large, the current conduction capability between the source 106 and the drain 105 is affected, and consequently, the power density of the high electron mobility transistor 100 is reduced. If the concentration is excessively small, the parasitic capacitance cannot be reduced, and the device gain of the high electron mobility transistor 100 does not increase.

When the injection depth of the fluorine ions meets 1 nm to 100 nm, and the injection concentration meets $10^{12}/\mathrm{cm}^2$ to $10^{15}/\mathrm{cm}^2$, it can be ensured that the concentration of the two-dimensional electron gas 1042 in the modulation region 1041 is $10^{12}/\mathrm{cm}^2$ to $10^{13}/\mathrm{cm}^2$. In this way, it is ensured that the parasitic capacitance below the field plate 108 is reduced, and the device gain of the high electron mobility transistor 100 is increased. In addition, the current conduction capability between the source 106 and the drain 105 is ensured, and the power density of the high electron mobility transistor 100 is not reduced.

As shown in FIG. 12, in the second method for reducing the concentration of the two-dimensional electron gas 1042, a specific operation of step S130 is: etching the barrier layer 103, where an etched region in the barrier layer 103 is a projection region of the modulation region 1041 on the barrier layer 103. The barrier layer 103 is partially etched, to damage a structure of the channel layer 104 between the original barrier layer 103 and the GaN substrate layer 102, so as to change a concentration of two-dimensional electron gas in a corresponding region (the modulation region 1041). It can be learned that this adjustment is a local damage to the structure of the channel layer 104, and affects only the concentration of the two-dimensional electron gas 1042 in the modulation region 1041 corresponding to the groove 1031. Therefore, this design is aimed at reducing the concentration of the two-dimensional electron gas in the modulation region 1041, and improving the device gain of the device by reducing the parasitic capacitance. In addition, this design also ensures a current conduction capability between the source 106 and the drain 105, so that the high electron mobility transistor 100 has high power density.

It should be noted that, the concentration of the two-dimensional electron gas 1042 in the channel layer 104 changes because the barrier layer 103 in the corresponding region is etched, and an original heterostructure of the barrier layer 103 and the GaN substrate layer 102 is damaged. Therefore, the modulation region 1041 in which the concentration of the two-dimensional electron gas 1042 is reduced and the etched groove 1031 are consistent in size and location in the first direction X. Similar to the first method for reducing the concentration of the two-dimensional electron gas 1042, the etched groove 1031 is also located below the field plate 108, and an area of the etched region accounts for 5% to 200% of an area of the projection region below the field plate 108. Different area proportions correspond to different effects of reducing the concentration of the two-dimensional electron gas 1042, and a larger area proportion indicates a more obvious decrease in the concentration of the two-dimensional electron gas 1042.

In the second method for reducing the concentration of the two-dimensional electron gas 1042, an etching depth range of the barrier layer 103 is 2 nm to 50 nm. The etching depth range is selected because a thickness of the barrier layer 103 is selected from 1 nm to 50 nm. Herein, the etching operation can be performed only on the barrier layer 103, and the GaN substrate layer 102 cannot be etched. Therefore, a maximum value of the etching depth range can reach 50 nm, and cannot exceed the thickness of the corresponding barrier layer 103. That is, if the thickness of the barrier layer 103 in this embodiment is 20 nm, a maximum etching depth can be 20 nm. The limitation on the etching depth is different from the limitation on the fluorine ion injection depth in the first method for reducing the concentration of two-dimensional electron gas 1042. In comparison, in fluorine ion injection, the fluorine ions may penetrate from the barrier layer 103 deep into the GaN substrate layer 102. This is because fluorine ion injection only neutralizes nearby two-dimensional electron gas 1042, but does not damage the formation of the heterostructure between the GaN substrate layer 102 and the barrier layer 103. Therefore, the depth of fluorine ion injection may exceed the thickness of the barrier layer 103. However, in the second method, an etching technology damages the original heterostructure between the GaN substrate layer 102 and the barrier layer 103. Therefore, the etching depth herein cannot exceed the barrier layer 103.

Figure 13:
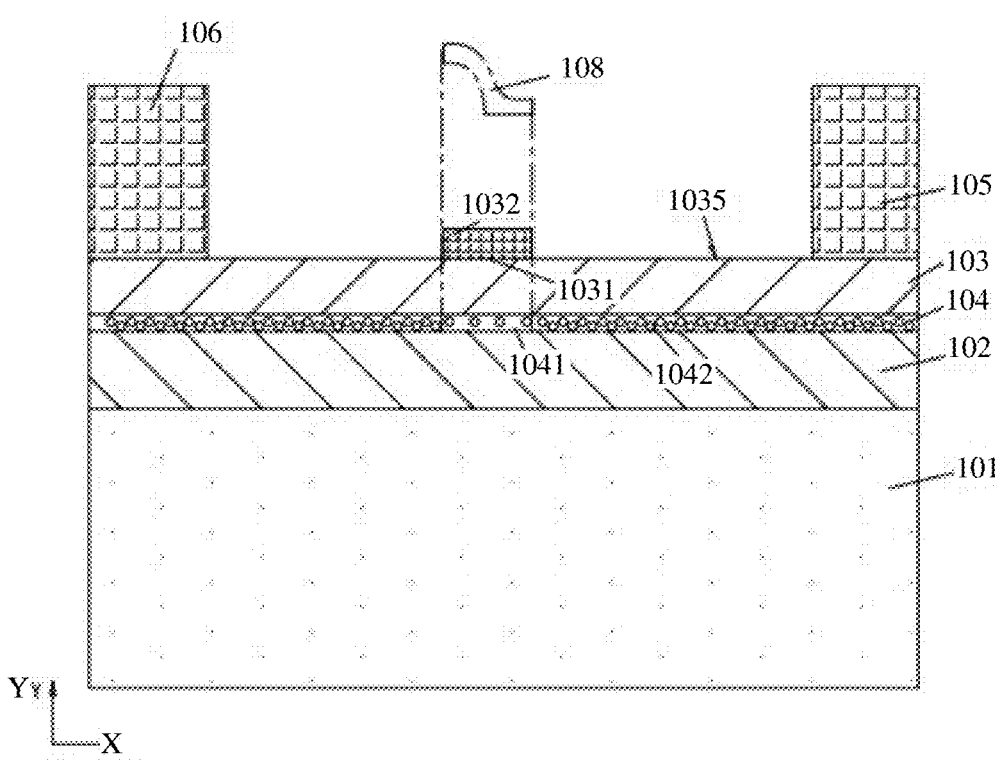
FIG. 13 is an example schematic diagram of step S130 of a manufacturing method for a high electron mobility transistor according to a third embodiment of this application.

As shown in FIG. 13, in the third method for reducing the concentration of the two-dimensional electron gas 1042, a specific operation of step S130 is: growing a high-power function material 1032 on a surface 1035 that is of the barrier layer 103 and that faces the dielectric layer 107, where a region used to grow the high-power function material 1032 is a projection region of the modulation region 1041 on the barrier layer 103. In this method, the high-power function material 1032 is grown on the surface 1035 of the barrier layer 103, and the high-power function material 1032 is used to deplete surrounding two-dimensional electron gas 1042, so as to reduce a concentration of two-dimensional electron gas 1042 in a corresponding region (the modulation region 1041). The high-power function material 1032 herein is usually a material such as a P-type semiconductor, nickel oxide, or metal.

In this solution, a region in which the high-power function material 1032 is grown is a growth region 1031. Because growth of the high-power function material 1032 directly affects a concentration change of the two-dimensional electron gas 1042 in the channel layer 104, the growth region 1031 determines a location and a size of the modulation region 1041 in the channel layer 104. Similar to the first method for reducing the concentration of the two-dimensional electron gas 1042, the growth region 1031 is located below the field plate 108, and an area of the growth region 1031 accounts for 200% of the area of the projection region below the field plate 108.

When the concentration of the two-dimensional electron gas 1042 in the modulation region 1041 is reduced by growing the high-power function material 1032, it should be noted that a growth thickness of the grown high-power function material 1032 is 2 nm to 200 nm. It may be understood that the high-power growth function material 1032 within this thickness range can improve a device gain of the high electron mobility transistor 100, and also ensure a current conduction capability between the source 106 and the drain 105, so that the high electron mobility transistor 100 has high power density.

It may be understood that, the foregoing three specific solutions can reduce the concentration of the two-dimensional electron gas 1042 in the modulation region 1041 in a targeted manner. A same point of the three solutions lies in that the modulation region 1041 in which the concentration of the two-dimensional electron gas 1042 is reduced is located below the field plate 108, so as to adjust electric field distribution of the depletion region below the field plate 108, thereby reducing the corresponding parasitic capacitance and improving the device gain of the high electron mobility transistor 100. However, it should be noted that the three solutions are all for a change of a concentration of local two-dimensional electron gas 1042 in the channel layer 104, have little impact on the concentration of the two-dimensional electron gas 1042 in the entire channel layer 104, and do not affect the current conduction capability between the source 106 and the drain 105. That is, the three solutions maintain high power density of the high electron mobility transistor 100.

Figure 10D:
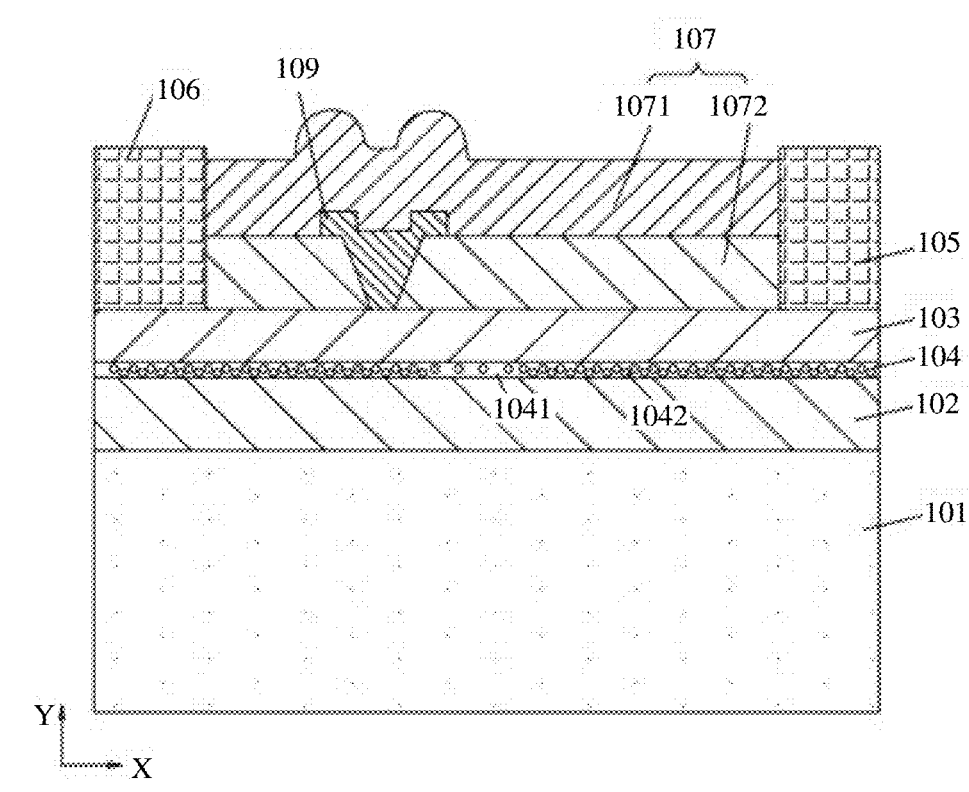

S140: Dispose the dielectric layer 107 on the barrier layer 103, where the dielectric layer 107 is located between the source 106 and the drain 105, as shown in FIG. 10d.

In a manufacturing process, an insulation medium is usually deposited between the source 106 and the drain 105 to form the dielectric layer 107. The insulation medium herein may be a material such as silicon nitride, silicon oxide, or aluminum oxide. A deposition manner may be plasma chemical vapor deposition, atomic layer deposition, low-pressure chemical vapor deposition, or the like.

Generally, the dielectric layer 107 herein is operated in two steps, that is, a first dielectric layer 1071 is first deposited and manufactured, and then a second dielectric layer 1072 is deposited and manufactured on the first dielectric layer 1071. It should be noted that a deposition thickness range of the first dielectric layer 1071 is 20 nm to 200 nm, and a deposition thickness of the second dielectric layer 1072 is 50 nm to 1000 nm.

Figure 14A:
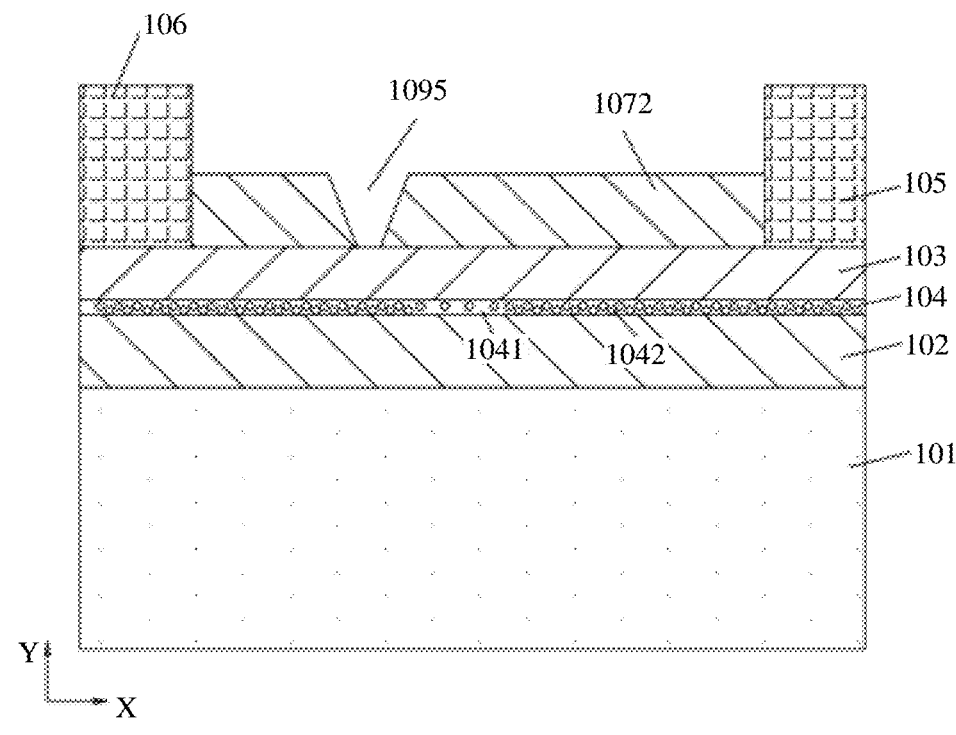
FIG. 14a to FIG. 14c are example process diagrams of manufacturing a field plate and a dielectric layer according to an embodiment of this application.
Figure 14B:
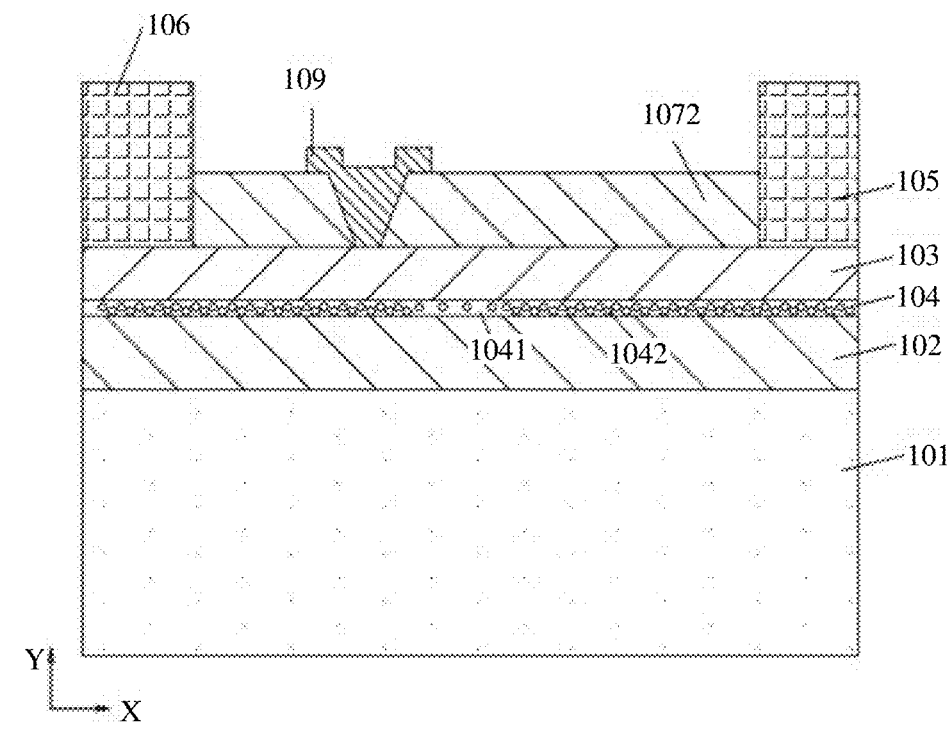
Figure 14C:
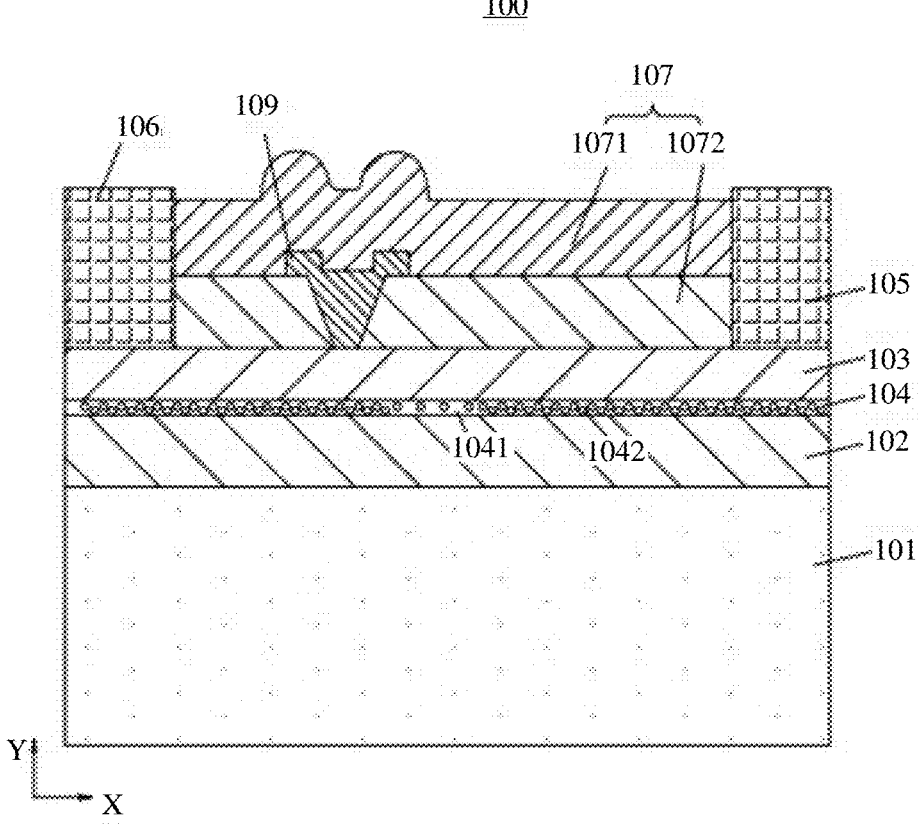

It should be noted that, herein, the first dielectric layer 1071 and the second dielectric layer 1072 are separately manufactured to form a gate 109 in the dielectric layer 107. As shown in FIG. 14a, FIG. 14b, and FIG. 14c, the following describes manufacturing of the gate 109: After the first dielectric layer 1071 is deposited and manufactured, photo-etching and etching are usually performed on the first dielectric layer 1071, to form a gate groove 1095 for manufacturing the gate 109. Generally, a length range of the gate groove 1095 in the first direction X is 10 nm to 1000 nm, and a depth of the gate groove 1095 in the second direction Y is 5 nm to 10 nm. After the gate groove 1095 is formed, the gate 109 is obtained by depositing metal, and then the second dielectric layer 1072 is deposited. It may be understood that, a dry etching manner or a wet etching manner may be selected in a manufacturing process, and may be specifically selected based on a requirement. When the gate 109 is being manufactured, a position of the gate 109 is not limited by the modulation region 1041, and the gate 109 may be partially located above the modulation region 1041, or may be far away from the modulation region 1041.

Figure 10E:
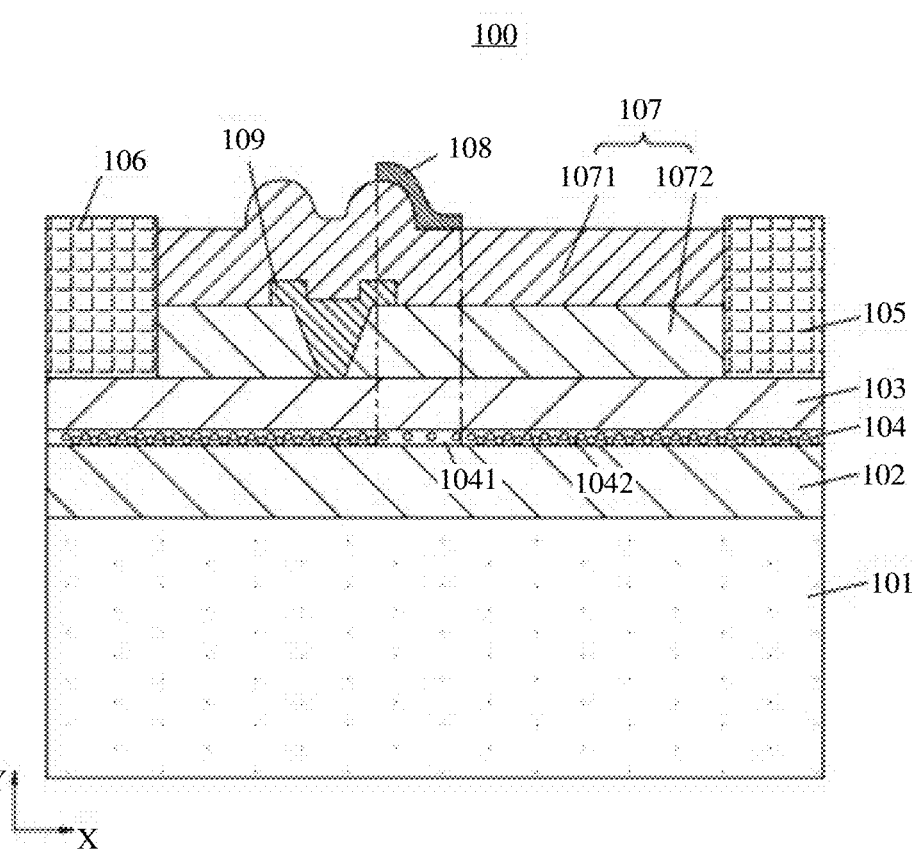

S150: Dispose the field plate 108 on the dielectric layer 107, where a projection region below the field plate 108 overlaps the modulation region 1041, as shown in FIG. 10e.

In a manufacturing process, the field plate 108 is formed on the dielectric layer 107 through photoetching and metal deposition. It should be noted that the projection region below the field plate 108 herein overlaps the modulation region 1041. As mentioned in step S130, the modulation region 1041 is selected in advance based on a position of the field plate 108 in a manufacturing process. In step S130, the region in which the concentration of the two-dimensional electron gas 1042 is reduced in the channel layer 104 is the modulation region 1041. The position of the modulation region 1041 is closely related to the position of the field plate 108 in step S150. Specifically, the projection region below the field plate 108 overlaps the modulation region 1041.

Figure 15:
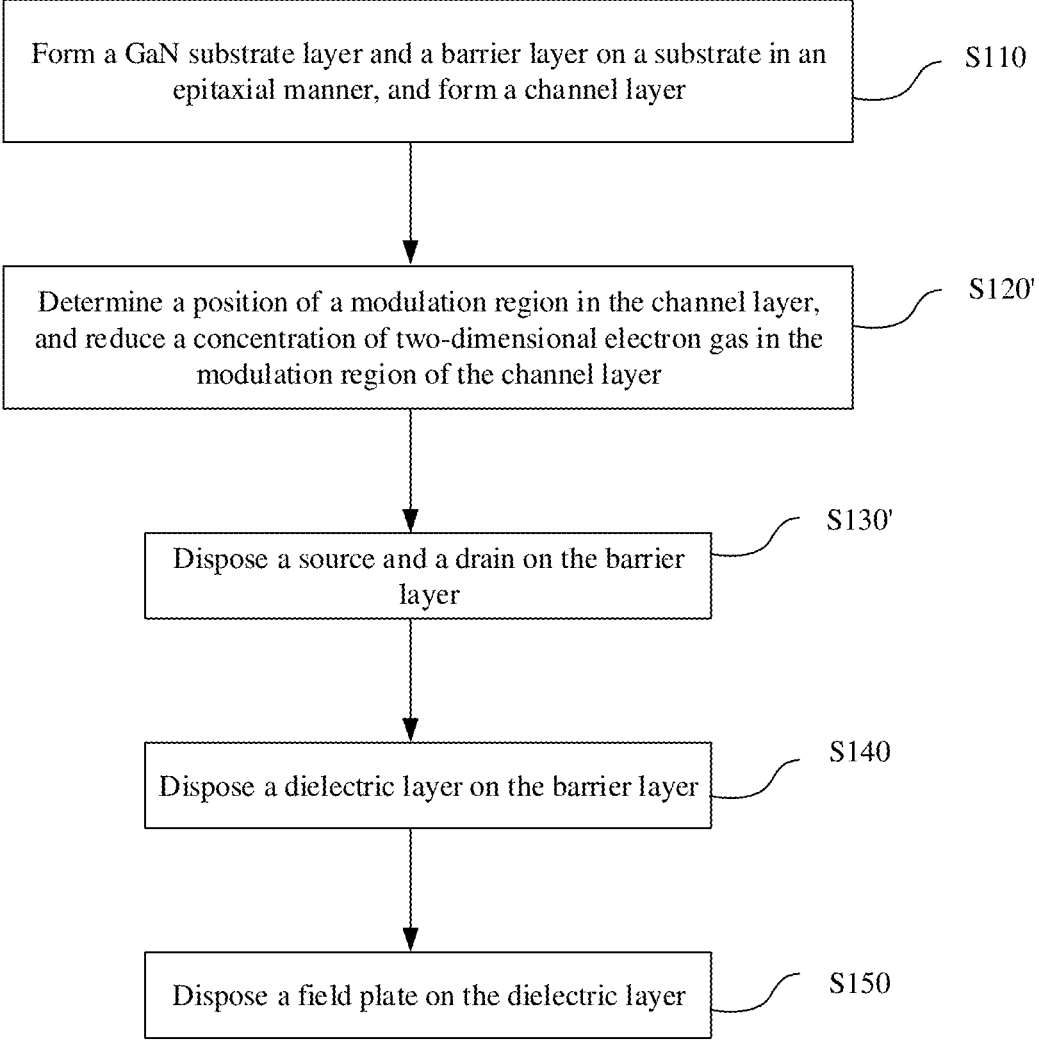
FIG. 15 is an example flowchart of manufacturing a high electron mobility transistor according to another embodiment of this application.
Figure 16:
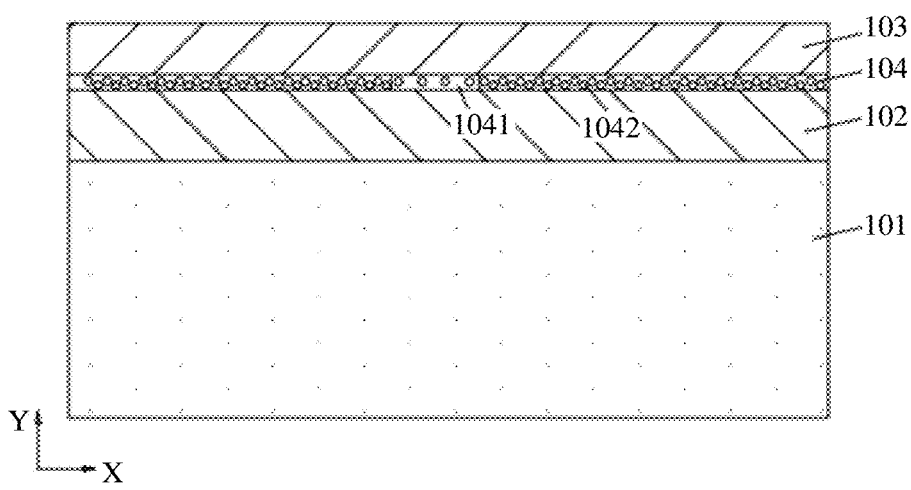
FIG. 16 is an example schematic diagram of step S120 of a manufacturing method for a high electron mobility transistor according to another embodiment of this application.
Figure 17:
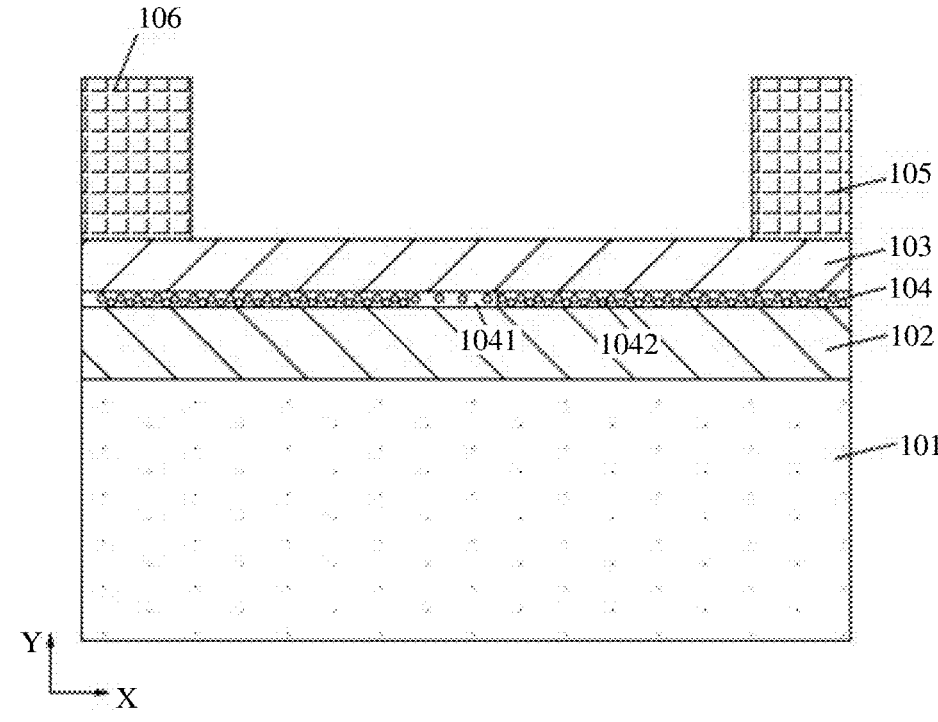
FIG. 17 is an example schematic diagram of step S130 of a manufacturing method for a high electron mobility transistor according to another embodiment of this application.

It should be noted that, in another implementation, refer to FIG. 15 to FIG. 17. FIG. is a flowchart of manufacturing a high electron mobility transistor 100. A specific manufacturing procedure is as follows:

S110: Form a GaN substrate layer and a barrier layer on a substrate in an epitaxial manner, and form a channel layer.

S120': Determine a position of a modulation region in the channel layer, and reduce a concentration of two-dimensional electron gas in the modulation region of the channel layer.

S130': Dispose a source and a drain on the barrier layer.

S140: Dispose a dielectric layer on the barrier layer.

S150: Dispose a field plate on the dielectric layer.

It can be learned that in this implementation, the concentration of the two-dimensional electron gas 1042 is first reduced, and then the source 106 and the drain 105 are manufactured on the barrier layer 103.

FIG. 16 is a schematic diagram of a process of step S120', and FIG. 17 is a schematic diagram of a process of step S130'. A difference between this implementation and the implementation shown in FIG. 9 lies in a sequence of reducing the concentration of the two-dimensional electron gas 1042 and manufacturing the source 106 and the drain 105. It may be understood that the sequence of the two steps is not particularly limited, and may be selected based on a manufacturing requirement in specific application.

In this embodiment, after the field plate 108 is disposed, global passivation processing or waterproof layer deposition is performed on the entire device, to ensure an electrical characteristic of the high electron mobility transistor 100 in a use process. In addition, in a manufacturing process of the high electron mobility transistor 100, structures such as a nucleation layer, an insertion layer, a buffer layer, and a bump layer are further formed. However, it should be noted that these structures also exist in the manufacturing process of the high electron mobility transistor 100.

The high electron mobility transistor 100 manufactured by using the foregoing method not only has a relatively high device gain, but also maintains high power density, can meet various high-frequency and high-power application environments, and is widely applied to the field of microwave technologies.

The foregoing describes in detail a high electron mobility transistor and a manufacturing method thereof, and an electronic device provided in the embodiments of this application. This specification describes the principles and embodiments of this application by using specific examples. The description about the foregoing embodiments is merely provided to help understand the method and the core idea of this application. In addition, a person of ordinary skill in the art may make variations and modifications to the specific embodiments and the application scope according to the idea of this application. Therefore, the content of this specification shall not be construed as a limitation on this application.

What is claimed is:

1. A high electron mobility transistor, comprising:
a gallium nitride (GaN) substrate layer, wherein
the GaN substrate layer includes a main body layer and a channel layer,
the main body layer and the channel layer are stacked,
the channel layer includes a modulation region and a non-modulation region, and
the non-modulation region surrounds the modulation region;
a barrier layer, wherein the barrier layer is adjacent to the channel layer;
a circuit layer, wherein
the circuit layer includes a source, a drain, and a dielectric layer, and
the dielectric layer is disposed between the source and the drain; and
a field plate, wherein
the field plate is located on a side of the dielectric layer away from the barrier layer,
the GaN substrate layer, barrier layer, circuit layer and field plate are sequentially stacked,
the modulation region and a field plate projection at least partially overlap,
a concentration of two-dimensional electron gas in the modulation region is less than a concentration of two-dimensional electron gas in the non-modulation region, and
the field plate projection includes an orthographic projection of the field plate on the channel layer, and
the barrier layer comprises:
a fluorine ion injection region having, wherein
the fluorine ion injection region includes a projection region, of the modulation region, on the barrier layer,
the fluorine ion injection region in a direction perpendicular to the barrier layer bas a size in the range of 1 nm to 100 nm, and
the fluorine ion injection region includes a fluorine ion concentration in the range of $10^{12}/cm^2$ to $10^{15}/cm^2$.

2. The high electron mobility transistor of claim 1, wherein
a groove is disposed in the barrier layer,
a groove opening of the groove is provided on a surface of the barrier layer facing the dielectric layer,
the groove is filled with the dielectric layer, and
a projection region of the modulation region on the barrier layer overlaps the groove.

3. The high electron mobility transistor of claim 1, wherein a growth region is disposed on a surface of the barrier layer facing the dielectric layer,
the growth region is a projection region of the modulation region on the barrier layer, and
a high-power function material is grown using the growth region, and the high-power function material is configured to generate an internal electric potential thereby reducing a concentration of two-dimensional electron gas in a corresponding region.

4. The high electron mobility transistor of claim 3, wherein
the high-power function material in the growth region in a direction perpendicular to the barrier layer has a thickness of 2 nm to 200 nm, and
the high-power function material is covered by the dielectric layer.

5. The high electron mobility transistor of claim 1, wherein the modulation region includes an area accounting for 5% to 200% of an area of a projection region below the field plate.

6. The high electron mobility transistor of claim 1, wherein the modulation region is included within the projection region below the field plate.

7. The high electron mobility transistor of claim 1, wherein the modulation region completely overlaps the projection region below the field plate.

8. The high electron mobility transistor of claim 1, wherein the projection region below the field plate is included within the modulation region.

9. The high electron mobility transistor of claim 1, wherein the concentration of the two-dimensional electron gas in the modulation region is in a range of $10^{12}/cm^2$ to $10^{13}/cm^2$.

10. A manufacturing method for a high electron mobility transistor, the method comprising:
forming a gallium nitride (GaN) substrate layer and a barrier layer on a substrate in an epitaxial manner, wherein a part of the GaN substrate layer adjacent to the barrier layer forms a channel layer;
disposing a source and a drain on the barrier layer;
determining a position of a modulation region in the channel layer;
reducing a concentration of two-dimensional electron gas in the modulation region of the channel layer, wherein
the position of the modulation region at least partially overlaps a projection of a preset position of a field plate on the channel layer;
disposing a dielectric layer on the barrier layer, wherein the dielectric layer is located between the source and the drain; and
disposing the field plate, on the dielectric layer, at the preset position, wherein reducing the concentration of the two-dimensional electron gas in the modulation region of the channel layer comprises:
injecting fluorine ions into the barrier laver, wherein the fluorine ions are injected in a projection region of the modulation region on the barrier layer,
the fluorine ions have an injection depth of 1 nm to 100 nm, and
the fluorine ions have an injection concentration of $10^{12}/cm^2$ to $10^{15}/cm^2$.

11. The manufacturing method of claim 10, wherein reducing the concentration of the two-dimensional electron gas in the modulation region of the channel layer comprises:
etching the barrier layer, wherein an etched region in the barrier layer includes a projection region of the modulation region on the barrier layer.

12. The manufacturing method of claim 10, wherein reducing the concentration of the two-dimensional electron gas in the modulation region of the channel layer comprises:

growing a high-power function material on a surface of the barrier layer facing the dielectric layer, wherein a region used to grow the high-power function material is a projection region of the modulation region on the barrier layer, and the high-power function material is configured to generate an internal electric potential thereby reducing a concentration of two-dimensional electron gas in a corresponding region.

13. The manufacturing method of claim 12, wherein the high-power function material has a growth thickness of 2 nm to 200 nm.

14. An electronic device, comprising:

a circuit board; and a chip, wherein the chip is disposed on the circuit board, the chip includes a substrate and a high electron mobility transistor disposed on the substrate, and the substrate comprises:

a gallium nitride (GaN) substrate layer, wherein the GaN substrate layer includes a main body layer and a channel layer, the main body layer and the channel layer are stacked; and the channel layer includes a modulation region and a non-modulation region;

a barrier layer, wherein the barrier layer is adjacent to the channel layer;

a circuit layer, wherein the circuit layer includes a source, a drain, and a dielectric layer; and a field plate, the GaN substrate layer, barrier layer, circuit layer and field plate are sequentially stacked, the modulation region and a field plate projection at least partially overlap, a concentration of two-dimensional electron gas in the modulation region is less than a concentration of two-dimensional electron gas in the non-modulation region, and the field plate projection includes an orthographic projection of the field plate on the channel layer, and the barrier layer comprises:

a fluorine ion injection region having, wherein the fluorine ion injection region includes a projection region, of the modulation region, on the barrier layer, the fluorine ion injection region in a direction perpendicular to the barrier layer has a size in the range of 1 nm to 100 nm, and the fluorine ion injection region includes a fluorine ion concentration in the range of $10^{12}/cm^2$ to $10^{15}/cm^2$.

15. The electronic device of claim 14, wherein a groove is disposed in the barrier layer, a groove opening of the groove is provided on a surface of the barrier layer facing the dielectric layer, the groove is filled with the dielectric layer, and a projection region of the modulation region on the barrier layer overlaps the groove.

16. The electronic device of claim 14, wherein a growth region is disposed on a surface of the barrier layer facing the dielectric layer, the growth region is a projection region of the modulation region on the barrier layer, and a high-power function material is grown using the growth region, and the high-power function material is configured to generate an internal electric potential thereby reducing a concentration of two-dimensional electron gas in a corresponding region.

17. The electronic device of claim 16, wherein the high-power function material in the growth region in a direction perpendicular to the barrier layer has a thickness of 2 nm to 200 nm, and the high-power function material is covered by the dielectric layer.

18. The electronic device of claim 14, wherein the modulation region includes an area accounting for 5% to 200% of an area of a projection region below the field plate.

19. The electronic device of claim 14, wherein the modulation region completely overlaps the projection region below the field plate.

20. The electronic device of claim 14, wherein the concentration of the two-dimensional electron gas in the modulation region is in a range of $10^{12}/cm^2$ to $10^{13}/cm^2$.

\* \* \* \* \*